United States Patent
Matsui et al.

(10) Patent No.: US 6,955,959 B2
(45) Date of Patent: Oct. 18, 2005

(54) METHOD OF MAKING A MEMORY STRUCTURE HAVING A MULTILAYERED CONTACT AND A STORAGE CAPACITOR WITH A COMPOSITE DIELECTRIC LAYER OF CRYSTALIZED NIOBIUM PENTOXIDE AND TANTALUM PENTOXIDE FILMS

(75) Inventors: Yuichi Matsui, Koganei (JP); Masahiko Hiratani, Akishima (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/853,133

(22) Filed: May 26, 2004

(65) Prior Publication Data

US 2004/0212000 A1 Oct. 28, 2004

Related U.S. Application Data

(63) Continuation of application No. 10/300,763, filed on Nov. 21, 2002, now Pat. No. 6,833,577.

(30) Foreign Application Priority Data

Feb. 14, 2002 (JP) ........................................ 2002-036129

(51) Int. Cl.[7] .............................................. H01L 27/108
(52) U.S. Cl. ........................ 438/238; 438/573; 438/608; 438/216; 438/29
(58) Field of Search ........................ 438/29, 573, 608, 438/216, 238

(56) References Cited

U.S. PATENT DOCUMENTS

| 5,605,733 A | 2/1997 | Ishikawa et al. |
| 5,622,888 A | 4/1997 | Sekine et al. |
| 6,075,691 A | 6/2000 | Duenas et al. |
| 6,576,928 B2 | 6/2003 | Hiratani et al. |

FOREIGN PATENT DOCUMENTS

| JP | 8-139288 | 5/1996 |
| JP | 2000-12796 | 1/2000 |
| JP | 2002-164516 | 6/2002 |

*Primary Examiner*—Fetsum Abraham
(74) *Attorney, Agent, or Firm*—Mattingly, Stanger, Malur & Brundidge, P.C.

(57) ABSTRACT

The present invention relates to a structure of a capacitor, in particular using niobium pentoxide, of a semiconductor capacitor memory device. Since niobium pentoxide has a low crystallization temperature of 600° C. or less, niobium pentoxide can suppress the oxidation of a bottom electrode and a barrier metal by heat treatment. However, according to heat treatment at low temperature, carbon incorporated from CVD sources into the film is not easily oxidized or removed. Therefore, a problem that leakage current increases arises. As an insulator film of a capacitor, a layered film composed of a niobium pentoxide film and a tantalum pentoxide film, or a layered film composed of niobium pentoxide films is used. By the use of the niobium pentoxide film, the dielectric constant of the capacitor can be made high and the crystallization temperature can be made low. By multiple-stage formation of the dielectric film, leakage current can be decreased.

14 Claims, 11 Drawing Sheets

METHOD OF MAKING A MEMORY STRUCTURE HAVING A MULTILAYERED CONTACT AND A STORAGE CAPACITOR WITH A COMPOSITE DIELECTRIC LAYER OF CRYSTALIZED NIOBIUM PENTOXIDE AND TANTALUM PENTOXIDE FILMS

This application is a continuation of application No. 10/300,763 filed Nov. 21, 2002, now U.S. Pat. No. 6,833,577.

BACKGROUND OF THE INVENTION

1. Field of the Invention

The present invention relates to a technique suitable for a semiconductor device and a process for producing the same, in particular, a semiconductor device having a capacitor, for example, a dynamic random access memory (DRAM), and a process for producing the same.

2. Description of Related Art

It is known that for large scale integration of semiconductor devices or other purposes, a tantalum pentoxide film having a dielectric constant of several tens is adopted instead of a silicon oxide film (dielectric constant: about 4) or a silicon nitride film (dielectric constant: about 7), which has been conventionally used as a capacitor dielectric film (for example, JP-A No. 139288/1998).

As a process for producing a capacitor having the tantalum pentoxide dielectric film, there is known a process of forming a tantalum pentoxide film on a capacitor bottom electrode, heat-treating the film to be crystallized, and then forming a capacitor top electrode thereon. The reason why the tantalum pentoxide film is heat-treated is to use a characteristic of tantalum pentoxide that its dielectric constant becomes larger when it is crystallized, and obtain a capacitor having a large electric capacitance. However, it is known that in order to crystallize the tantalum pentoxide film sufficiently in this production process, it is necessary to conduct heat treatment at a high temperature of 750° C. or more (for example, JP-A No. 12796/2000). The temperature at which the heat treatment for crystallizing a dielectric film is conducted is referred to as the "crystallization temperature" hereinafter.

Capacitor structure will be described before description on problems resulting from the matter that heat treatment at 750° C. or more, which is a relatively high temperature, is required for crystallization.

A capacitor using a tantalum pentoxide film as a dielectric film is roughly classified into MIS (metal-insulator-semiconductor) structure, which uses a polycrystalline silicon film as a bottom electrode, and MIM (metal-insulator-metal) structure, which uses a metal film as a bottom electrode. Differences between the MIS structure and the MIM structure are the following: 1) Their bottom electrode materials are different. 2) A barrier metal is necessary for the MIM structure. The barrier metal is formed between the bottom electrode and a plug connected to the bottom electrode, and is necessary for preventing reaction between the bottom electrode and the plug. If the plug reacts with the bottom electrode, a bad effect is produced on electrical conductivity. An example of the barrier metal is titanium nitride formed between a plug made of polycrystalline silicon and a bottom electrode made of ruthenium.

The following will describe problems resulting from the matter that heat treatment at 750° C. or more, which is a relatively high temperature, is required for crystallization in a process for forming a tantalum pentoxide insulator film. The MIS structure is heat-treated, thereby oxidizing silicon of its bottom electrode. As a result, the capacitance thereof drops. The reason for the drop is that since silicon is more easily subjected to thermodynamic oxidation than tantalum, silicon reduces the tantalum pentoxide film during heat treatment for crystallization of tantalum pentoxide so that a silicon oxide film, which has a small dielectric constant, is formed. The problem of the drop in the capacitor capacitance is also generated in the case of forming a silicon nitride film on the surface of the bottom electrode to prevent oxidation of silicon. Because the silicon nitride film is oxidized for the same reason so that the capacitor capacitance drops. In the MIM structure, its barrier metal is oxidized by oxygen diffusing in its metal electrode even if the metal electrode itself does not undergo any problem of oxidation. As a result, the electrical conductivity thereof is damaged. The reason for the damage is as follows: For example, in the case that the bottom electrode is made of ruthenium, oxygen atoms easily diffuse through ruthenium so that oxygen accumulates in the bottom electrode in the step in which the tantalum pentoxide film is formed; therefore, the barrier metal is oxidized by the accumulating oxygen in a subsequent step of heat treatment for crystallization of the dielectric film.

The respective problems peculiar to the MIS structure and the MIM structure do not depend on atmosphere at the time of the heat treatment for crystallization. When a capacitor is formed using a tantalum pentoxide film, heat treatment may be conducted in oxygen atmosphere. Even if the oxidation temperature in the heat treatment is made low so that the oxidation of the bottom electrode and the barrier metal can be suppressed, the problems are not fundamentally solved if the crystallization temperature cannot be made low.

As far as tantalum pentoxide is used as the capacitor dielectric film, it is very difficult to make the temperature for crystallizing tantalum pentoxide as low as 750° C. or less. Examples of the heat treatment in oxygen atmosphere include heat treatment performed in oxidation atmosphere to repair oxygen vacancy in the capacitor dielectric film, and heat treatment performed in oxidation atmosphere to remove residual carbon, which causes leakage current in the capacitor dielectric film formed by chemical vapor deposition (CVD) or the like.

Thus, in order to solve the problems based on a relatively high heat treatment temperature for crystallizing the tantalum pentoxide insulator film, the present inventors added niobium pentoxide to tantalum pentoxide and examined change in various properties.

First, FIG. 10 shows experimental results about a MIM structure. As a sample, there was used a film made of a composition tantalum pentoxide and niobium pentoxide and formed on a structure of Pt (200 nm)/Ti (10 nm)/SiO$_2$ (100 nm) by sputtering. To form the film, a mixed gas of N$_2$ and O$_2$ (pressure ratio between N$_2$ and O$_2$: 1/1) having a pressure of 10 mTorr was used. The substance temperature was 300° C., and the film thickness was 20 nm. After the formation of the insulator film, heat treatment was conducted within the temperature range of 500 to 800° C. in nitrogen gas flow for 1 minute. Thereafter, heat treatment was conducted at a temperature of 500° C. in oxygen gas flow for 2 minutes. The temperatures for crystallizing a solid solution of tantalum pentoxide and niobium pentoxide formed under the above-mentioned conditions and the dielectric constants thereof after the crystallization were compared in the case that the ratio of Nb was 0%, 10%, 50%, 90% and 100%, respectively. The results are shown in FIG. 10. The transverse axis thereof represents the Nb content, and the vertical axes thereof represent the crystallization temperature and the dielectric constant. In the case that the Nb ratio was 0%, that is, in the case of the film made only of tantalum pentoxide, the crystallization temperature was about 750° C. and the dielectric constant was about 30. As the Nb content was increased, the crystallization temperature lowered and simultaneously the dielectric constant increased. In the case that the ratio of Nb was 100%, that is, in the case of the film made only of niobium pentoxide, the crystallization temperature was about 500° C. and the dielectric constant was about 60. In order to set the crystallization temperature to 700° C. or less, at which oxidation of the bottom electrode and the barrier metal can be suppressed up to such a degree that no problem is caused, it is advisable that Nb is added at a ratio of at least 10%

Experimental results about a MIS structure are shown in FIG. 11. The temperatures for crystallizing a solid solution of tantalum pentoxide and niobium pentoxide formed on silicon and the dielectric constants thereof after the crystallization were compared in the case that the ratio of Nb was 0%, 10%, 50%, 90% and 100%, respectively. The results are shown in FIG. 11. The transverse axis thereof represents the Nb content, and the vertical axes thereof represent the crystallization temperature and the dielectric constant. In the case that the Nb ratio was 0%, that is, in the case of the film made only of tantalum pentoxide, the crystallization temperature was about 750° C. and the dielectric constant was about 40. In order to set the crystallization temperature to 700° C. or less, at which oxidation of the bottom electrode can be suppressed up to such a degree that no problem is caused, it is advisable that Nb is added at a ratio of 60% or more. As the Nb content was increased, the crystallization temperature lowered and simultaneously the dielectric constant increased. This tendency is the same as in FIG. 10. However, FIG. 11 is different from FIG. 10 in that at an Nb ratio of 50%, the crystallization temperature rises up to about 750° C.

FIG. 12 shows results of comparison of leakage current densities of insulator films having different Nb ratios. The transverse axis represents voltage, and the vertical axis represents the leakage current density. The heat treatment temperature was 700° C. As the Nb content was increased, the leakage current density increased.

As described above, in order to avoid a relatively high heat treatment temperature when a tantalum pentoxide insulator film is adopted as the dielectric film, it is effective to use a film to which niobium pentoxide is added or a film made only of niobium pentoxide. As understood from FIG. 12, however, the inventors found out a problem that when niobium pentoxide is added, leakage current density increases.

SUMMARY OF THE INVENTION

The present invention for solving the above-mentioned problems will be described hereinafter.

According to a first aspect of the present invention, an insulator film of a capacitor is made of a layered film composed of a niobium pentoxide film and a tantalum pentoxide film.

As is evident from FIGS. 10, 11 and 12, a tantalum pentoxide film has a small leakage current but has a high crystallization temperature. Contrarily, a niobium pentoxide film has a low crystallization temperature but has a large leakage current. On the basis of the results, the inventors have considered that a layered film of a tantalum pentoxide film and a niobium pentoxide film is effective. Specifically, a niobium pentoxide film is formed on a bottom electrode, and the resultant is heat-treated at a temperature lower than 750° C. so as to be crystallized. A tantalum pentoxide film is formed thereon, and the resultant is heat-treated. In this way, tantalum pentoxide is laminated on the undercoat having a crystal structure of niobium pentoxide. As a result, the crystallization temperature of the tantalum pentoxide film is affected by the crystal structure of the niobium pentoxide film so as to be made low. Simultaneously, the tantalum pentoxide film is present in the layered film; therefore, the leakage current density can also be kept small.

To verify the effect of the layered film, a tantalum pentoxide single-layered film ($Ta_2O_5$), a bi-layered film composed of a tantalum pentoxide film and a niobium pentoxide film ($Ta_2O_5/Nb_2O_5$), and a niobium pentoxide single-layered film ($Nb_2O_5$) were formed, and then the crystallization temperatures and the leakage current densities thereof were compared. Each of the tantalum pentoxide single-layered film and the niobium pentoxide single-layered film was formed by forming a corresponding single-layered film having a film thickness of 20 nm, heat-treating the film at a temperature of 500 to 750° C. in nitrogen for one minute, and then heat-treating the film at a temperature of 500° C. in oxygen for two minutes. The layered film composed of tantalum pentoxide and niobium pentoxide was formed through the step of forming a niobium pentoxide film having a film thickness of 5 nm and then heat-treating the film at a temperature of 500° C. in nitrogen for one minute and the step of forming a tantalum pentoxide film having a film thickness of 15 nm on the niobium pentoxide, heat-treating the layered film at a temperature of 500 to 750° C. in nitrogen for one minute, and then heat-treating the layered film at a temperature of 500° C. in oxygen for two minutes.

FIG. 13 shows the dependency of the dielectric constant of each of the above-mentioned dielectric films on heat treatment temperature. The transverse axis represents the heat treatment temperature and the vertical axis represents the dielectric constant. The tantalum pentoxide single-layered film is amorphous after the formation thereof, and the dielectric constant thereof is about 20. When the tantalum pentoxide single-layered film is heat-treated at 750° C., the film is crystallized and the dielectric constant thereof increases to about 30. On the other hand, the niobium pentoxide single-layered film is amorphous after the formation thereof and the dielectric constant thereof is about 30. However, this film is crystallized by heat treatment at a temperature of at lowest 500° C. so that the dielectric constant thereof increases to about 60. The layered film composed of tantalum pentoxide and niobium pentoxide, suggested by the present invention, is already crystallized immediately after the formation of the tantalum pentoxide film and the dielectric constant thereof is about 50. This results from the matter that the crystallization temperature of the tantalum pentoxide film is made lower since the tantalum pentoxide film is formed on the crystal structure of the niobium pentoxide film which is already crystallized. In general, the tantalum pentoxide film on the niobium pentoxide film is sufficiently crystallized even by heat treatment at such a temperature that tantalum pentoxide is not easily crystallized. The dielectric constant of the tantalum pentoxide film increases to substantially equal to that of the niobium pentoxide single-layered film.

Next, comparison between leakage current densities is shown in FIG. 14. The transverse axis thereof represents voltage, and the vertical axis thereof represents leakage current density. About the tantalum pentoxide single-layered film, the crystallization temperature is set to 750° C. About the layered film composed of the tantalum pentoxide film and the niobium pentoxide film, and the niobium pentoxide single-layered film, the crystallization temperature is set to 500° C. The leakage current of the niobium pentoxide film is by far larger than that of the tantalum pentoxide film. However, by laminating the tantalum pentoxide film thereon, the property substantially equal to that of the tantalum pentoxide single-layered film can be obtained. This demonstrates that the leakage current of the layered film composed of tantalum pentoxide and niobium pentoxide is reinforced by the tantalum pentoxide film.

In other words, by forming a lamination of a tantalum pentoxide film and a niobium pentoxide film, drawbacks of the respective films are cancelled so that the crystallization temperature of the tantalum pentoxide film is lowered to a temperature substantially equivalent to that of the niobium pentoxide single-layered film. A dielectric constant as high as that of the niobium pentoxide film can be obtained. Simultaneously, a capacitor having a leakage current density as low as that of the tantalum pentoxide single-layered film can be realized.

In the present context, examples wherein a layered film composed of a tantalum pentoxide film and a niobium pentoxide is used have been described. However, the present invention is not limited to the examples. The basic conception thereof is that: the formation of a dielectric film made of a material which originally has a high crystallization temperature on a dielectric film made of a material which has a low crystallization temperature causes the crystallization temperature of the upper layer to be lowered and causes the oxidation of the bottom electrode and the barrier metal to be prevented; and the upper layer which has a better leakage current property than the lower layer makes it possible to decrease leakage current between the bottom electrode and the top electrode. For example, both of the upper and lower layers may be made of a solid solution of tantalum pentoxide and niobium pentoxide. In this case, when the upper layer and the lower layer are represented by $(Ta_{1-x}Nb_x)_2O_5/(Ta_{1-y}Nb_y)_2O_5$, it is effective to keep the relationship of x<y. In short, it is advisable that the niobium pentoxide content in the lower layer is larger than the niobium pentoxide content in the upper layer. The lower layer satisfying this relationship is crystallized at a temperature lower than the upper layer and causes the crystallization temperature of the upper layer to be lowered. The upper layer having a better leakage current property than the lower layer makes it possible to decrease leakage current. However, as the difference between the niobium pentoxide content in the formed upper layer and the niobium pentoxide content in the lower layer is smaller, this effect is smaller.

According to a second aspect of the present invention, an insulator film of a capacitor is made of a layered film of niobium pentoxide films.

Specifically, a niobium pentoxide film is firstly on a bottom electrode, and then crystallized by heat treatment at a low temperature. A niobium pentoxide film is formed thereon and then heat-treated. The use of the niobium pentoxide films, which have a low crystallization temperature, as dielectric films, makes it possible to prevent the bottom electrode and the barrier metal from being oxidized. The formation of the dielectric film at plural stages causes the boundary of grains, which functions as a leakage pass, to be separated. Furthermore, to make the film thickness per layer of the layered film small causes residual carbon, which causes serious problems in heat treatment at low temperature, to be easily removed. Therefore, the leakage current of the capacitor can be decreased. Moreover, to make the film thickness per layer of the layered film small also causes a decrease in stress against the film and improvement in the quality of the film and the morphology thereof, thereby contributing to the decrease in the leakage current.

To demonstrate the effect of the formation of the niobium pentoxide film at plural stages, a niobium pentoxide film 10 nm in film thickness was formed on polycrystalline silicon at one stage, two stages or three stages and the leakage current densities thereof were compared. The niobium pentoxide film was formed by CVD using, as source gases, pentaethoxy niobium, and oxygen. At this time, the substrate temperature was set to 430° C. Heat treatment was conducted at 600° C. in oxygen gas flow for one minute. FIG. 15 shows the effect of decreasing the leakage current density by the formation at the plural stages. The transverse axis thereof represents voltage, and the vertical axis thereof represents the leakage current density. In the case of the single stage formation, a niobium pentoxide film was formed to have a thickness of 10 nm, and then heat-treated. In the case of the two-stage formation, a niobium pentoxide film was formed to have a thickness of 5 nm, and then heat-treated. Thereafter, a niobium pentoxide film was formed to have a thickness of 5 nm, and again heat-treated. In the case of the three-stage formation, a niobium pentoxide film was formed to have a thickness of 3 nm, and then heat-treated. Thereafter, a niobium pentoxide film was formed to have a thickness of 3 nm, and again heat-treated. Furthermore, a niobium pentoxide film was formed to have a thickness of 4 nm, and then heat-treated. As is evident from FIG. 15, by forming the niobium pentoxide film at the plural stages, the leakage current is decreased. One of reasons for this fact is that: by making the film thickness per layer of the layered film small by the plural-stage formation, it is possible to solve the problem that when the heat treatment temperature is made lower, oxygen does not diffuse easily in the film so that the efficiency of removing carbon, which should be discharged as carbon dioxide, deteriorates.

In order to obtain this effect of decreasing the leakage current, it is desired to make all of the layers thin. However, this effect can be obtained by making thin the thickness of any one of the plural insulator layers made of niobium pentoxide in the capacitor. This is because even when only one of the insulator layers is improved in leakage current property, the leakage current property of the whole is improved. Even in the case of a layered film composed of a tantalum pentoxide film and a niobium pentoxide film, as described as the first aspect, or even in the case of $(Ta_{1-x}Nb_x)_2O_5/(Ta_{1-y}Nb_y)_2O_5$ satisfying the relationship of x<y, the carbon-removing efficiency can be raised by making the film thickness thin, so that the leakage current property of the whole of the layered film can be improved.

The utilization of the above-mentioned aspect of the present invention makes it possible to realize a capacitor exhibiting a high dielectric constant and a small leakage current even by heat treatment at a low temperature of 700° C. or less.

In the present context, examples wherein a layered film composed of a niobium pentoxide layer and another niobium pentoxide film is used have been described. However, the present invention is not limited to the example. In the case that a solid solution of tantalum pentoxide and niobium pentoxide is used as the material having a low crystallization temperature, a capacitor having the above-mentioned property can also be realized.

The following will compare and investigate the effects of the manner of forming a lamination of a niobium pentoxide film and a tantalum pentoxide film, which is the first aspect of the present invention, and the manner of forming a lamination of one niobium pentoxide film and another niobium pentoxide, which is the second aspect of the present invention.

According to the first and second aspects, it is possible to lower the crystallization temperature, prevent the bottom electrode and the barrier metal from being oxidized, and decrease the leakage current. However, the first aspect is superior to the second aspect in the decrease in the leakage current since the tantalum pentoxide film causing a smaller leakage current is used as the dielectric film. The second aspect is superior to the first aspect in easiness of production of a semiconductor device and a decrease in costs for the following reason: The respective dielectric films constituting the lamination are made of the same material; therefore, it is unnecessary to set separately a means for supplying a source gas for forming the niobium pentoxide film and a means for supplying a source gas for forming the tantalum pentoxide film, or handle the two different source gases for the layered film.

Subject matters common to the first and second aspects of the present invention are as follows: The dielectric film of a capacitor is made of a bi- or multi-layered insulator, thereby separating the crystal boundaries therein; and the lower dielectric layer of the capacitor is made into a layer comprising niobium pentoxide and the upper dielectric layer is made into a tantalum pentoxide layer, a niobium pentoxide layer, or a layer made of a composition of tantalum pentoxide and niobium pentoxide, whereby the crystallization temperature of the dielectric film can be made lower than that of a tantalum pentoxide film. As a result, the bottom electrode and the barrier metal of the capacitor can be prevented from being oxidized so that the capacitor can be formed as a capacitor having a good leakage current property.

An example of this capacitor includes a capacitor having a dielectric film composed of a lower layer made of a composition of tantalum pentoxide and niobium pentoxide and an upper layer made of niobium pentoxide. In the case of this capacitor, the crystallization temperature of the material used for the lower layer is higher than that of the material used for the upper layer. Thus, the capacitor does not have the effect of lowering the heat treating temperature of the upper layer to that of the lower layer by forming the dielectric film made of the material which originally has a high crystallization temperature on the dielectric film made of the material having a low crystallization temperature. However, the capacitor has an effect of making the heat treatment temperature for crystallizing the dielectric film lower than the heat treatment temperature for crystallizing any conventional tantalum pentoxide film. As a result, the bottom electrode and the barrier metal can be prevented from being oxidized by the heat treatment.

According to the present invention, the heat treatment temperature of the capacitor dielectric film can be made low; therefore, it is possible to suppress a decrease in the capacitance based on the oxidization of the polycrystalline silicon bottom electrode (MIS structure), and an increase in the contact resistance based on the oxidization of the barrier metal (MIM structure). In other words, it is possible to realize high integration based on making semiconductor capacitor elements fine; an improvement in the yield of semiconductor devices based on making the production process simple and more reliable; and so on. This makes it possible to increase signal quantity to improve the reliability of device operation, or decrease the height of the capacitor to decrease process load.

By making the capacitor dielectric film into a layered film and separating crystal boundaries in the dielectric film, leakage current can be decreased. Furthermore, by making the film thickness of the insulator film constituting the layered film small, stress in the film is reduced and the density of the film and the morphology thereof are improved so that leakage current can be decreased.

DETAILED DESCRIPTION OF THE PREFERRED EMBODIMENTS

Figure 1:
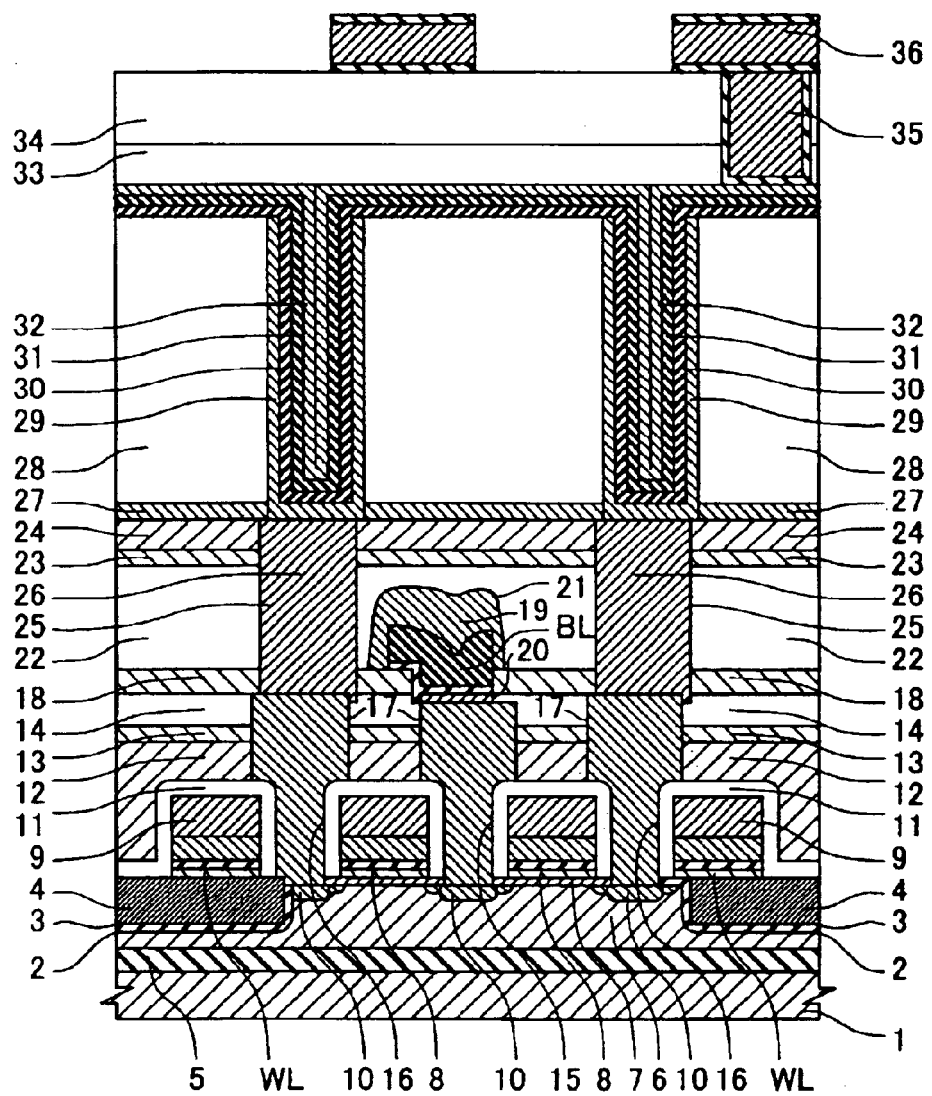
FIG. 1 is a vertical sectional view of a step for explaining Embodiment 1 of the present invention.

Embodiments of the present invention will be described in detail hereinafter, referring to the drawings. In all of the figures, which are referred to for the description of the embodiments, the same reference numbers are attached to members having the same function, and repeated description thereof is omitted.

Embodiment 1

Referring to FIG. 1, Embodiment 1 of the present invention will be described. This is an embodiment wherein the present invention is applied to a semiconductor memory device having a MIM capacitor using a dielectric film made of a layered film composed of a niobium pentoxide film and a tantalum pentoxide film, in particular, such a DRAM.

A process for producing the DRAW will be described.

FIG. 1 is a sectional view of the DRAW to which a capacitor of the present invention is applied. First, an element isolation region and a p-type well 6 to which an impurity is introduced are formed in a semiconductor substrate 1. For a P-type, a semiconductor substrate 1 made of single crystal silicon having a resistivity of 10 Ωcm is prepared. On the semiconductor substrate 1 are deposited, for example, a thin silicon oxide (not illustrated) having a film thickness of about 10 nm and formed by wet oxidation at about 850° C. and a silicon nitride film (not illustrated) having a film thickness of about 140 nm and formed by CVD. The context exemplifies the single crystal silicon semiconductor substrate 1. However, there may be used an SOI (silicon on insulator) substrate having, on its surface, a single crystal silicon layer, or a substrate made of a dielectric, such as glass or a ceramic, having, on its surface, a polycrystalline silicon film.

Next, a photoresist (not illustrated) is used as a mask to pattern the silicon nitride film and the silicon oxide film in the region where a groove 2 is to be made, and then this silicon nitride film is used as a mask to dry-etch the semiconductor substrate 1. In this way, the groove 2 having a depth of about 300 to 400 nm is made in the semiconductor substrate 1 in the element isolation region.

Next, the photoresist film is removed. Thereafter, in order to remove a damaged layer generated on inner walls of the groove 2 by the etching, for example, a thin silicon oxide film 3 (having a film thickness of about 10 nm) resulting from wet oxidation at about 850 to 900° C. is formed on the inner walls of the groove 2. A silicon oxide film having a film thickness of about 300 to 400 nm, which is formed by plasma CVD using ozone ($O_3$) and tetraethoxysilane (TEOS) as source gases is deposited thereon. This silicon oxide film may be sintered by dry oxidation at about 1000° C.

Next, this silicon oxide film is polished by CMP (chemical mechanical polishing), to remove the silicon oxide film in the region other than the groove 2. In this way, an element isolation region is formed in the state that the silicon oxide film 4 remains inside the groove 2. Before the polishing by the CMP, a silicon nitride film is formed in the region of the groove 2 so that dishing, which is a phenomenon that the silicon oxide film in the region of the groove 2 is polished up to an excessive depth, can be prevented.

Next, the silicon oxide film and the silicon nitride film remaining on the surface of the semiconductor substrate 1 are removed by wet etching with, for example, hot phosphoric acid. Thereafter, the semiconductor substrate 1 in a region where memory cells are to be formed (i.e., a memory array) is ion-implanted with an N-type impurity, for example, P (phosphorus) to form an N-type semiconductor region 5, and then is ion-implanted with a P-type impurity, for example, B (boron) to form a P-type well 6. Following the ion-implantation, the P-type well 6 is ion-implanted with an impurity for adjusting the threshold voltage of a MISFET which will be obtained, for example, $BF_2$ (boron fluoride). The N-type semiconductor region 5 is formed to prevent noises from entering the P-type well 6 of the memory array through the semiconductor substrate 1 from an input/output circuit or the like.

Next, the surface of the semiconductor substrate 1 is washed with, for example, a HF (fluorinated acid)-based washing liquid, and then subjected to wet oxidation at about 850° C., to form a clean gate oxide film 7 having a film thickness of about 5 nm on the surface of the P-type well 6. After the formation of the gate oxide film 7, the semiconductor substrate 1 may be heat-treated in NO (nitrogen oxide) atmosphere or $N_2O$ (nitrous oxide) atmosphere to segregate nitrogen (oxynitriding) in the interface between the gate oxide film 7 and the semiconductor substrate 1. This step is not essential. When the gate oxide film 7 is as thin as about 5 nm, strain generated in the interface between the gate oxide film 7 and the semiconductor substrate 1 becomes apparent on the basis of a thermal expansion coefficient difference between the two, so that the generation of hot carriers is induced. Since the nitrogen segregated in the interface between the substrate 1 and the gate oxide film 7 relieves the strain, the above-mentioned oxynitriding treatment makes it possible to improve the reliability of the very thin gate oxide film 7.

Next, gate electrodes 8 are formed on the gate oxide film 7. Each of the gate electrodes 8 will constitute a part of the MISFET for selecting a memory cell, and is used as a word line WL in the region other than active regions. The width of this gate electrode 8 (word line WL), that is, the gate length, is made into a minimum size (for example, about 0.12 μm) within a tolerance range making it possible to suppress short channel effect of the memory cell selecting MISFET and keep the threshold voltage at a given value or more. The interval between the adjacent gate electrodes 8 (word lines WL) is made into a minimum size (for example, 0.11 μm) specified by the resolution limit of photolithography. The gate electrodes 8 (word lines WL) are formed by depositing a polycrystalline silicon film doped with an N-type impurity such as P (phosphorus) and having substrate 1 by CVD, depositing thereon a WN (tungsten nitride) film having a film thickness of about 50 nm and a W film having a film thickness of about 100 nm by sputtering, depositing a silicon nitride film 9 having a film thickness of about 150 nm thereon by CVD, and then using a photoresist film as a mask to pattern these films. The WN film functions a barrier film for preventing the formation of a high-resistance silicide film between the W film and the polycrystalline silicon film by reaction of the two films at the time of heat treatment at high temperature. As the barrier layer, a TiN (titanium nitride) film or the like may be used instead of the WN film. In the case that a part of the gate electrodes 8 (word lines WL) is made of a low-resistance metal (W), the sheet resistivity thereof can be decreased to about 2 to 2.5 Ω/□; therefore, word line delay can be reduced. Since word line delay can be reduced even if the gate electrodes 8 (word lines WL) are not lined with an Al interconnection or the like, the number of interconnection layers formed over the memory cells can be made still smaller.

Next, the photoresist film is removed, and subsequently dry etching residues, photoresist residues and so on, which remain on the surface of the semiconductor substrate 1, are removed with an etching solution such as fluorinated acid. When this wet etching is performed, the gate oxide film 7 on the region other than the regions beneath the gate electrodes 8 (word lines WL) is etched and further the gate oxide film 7 below the side walls of the gates is isotropically etched to generate undercuts. Therefore, the withstand voltage of the gate oxide film 7 lowers if no additional operation is performed. Thus, the semiconductor substrate 1 is subjected to wet oxidation at about 900° C., so that the film quality of the gate oxide film 7 to be etched is improved.

Next, the P-type well 6 is ion-implanted with an N-type impurity such as P (phosphorus) to form N-type semiconductor regions 10, in the P-type well 6, at both sides of each of the gate electrodes 8. In this way, memory cell selecting MISFETs are formed in the memory array.

Next, a silicon nitride film 11 having a film thickness of about 50 to 100 nm is deposited over the semiconductor substrate 1 by CVD. Thereafter, this is spin-coated with an SOG (spin on glass) film 12 having a film thickness of about 300 nm, and then the semiconductor substrate 1 is heat-treated at 800° C. for about 1 minute to sinter the SOG film 12. A silicon oxide film 13 having a film thickness of about 600 nm is deposited on the SOG film 12, and then this silicon oxide film 13 is polished by CMP, to planarize the surface thereof. A silicon oxide film 14 having a film thickness of about 100 nm is deposited on the silicon oxide film 13. This silicon oxide film 14 is deposited in order to repair fine injuries in the surface of the silicon oxide film 13, which are generated by the polishing based on the CMP. The silicon oxide films 13 and 14 are deposited, for example, by plasma CVD using ozone ($O_3$) and tetraethoxysilane (TEOS) as source gases. Instead of the silicon oxide film 14, a PSG (phosphor silicate glass) film or the like may be deposited.

As described above, in the present embodiment, the SOG film 12, which has a high reflow property, is applied over the gate electrodes 8 (word lines WL), and further the silicon oxide film 13 deposited thereon is planarized by CMP. This step makes it possible to improve capability of filling fine gaps between the gate electrodes 8 (word lines WL) and further planarize the insulator film over the gate electrodes 8 (word lines WL).

Next, a photoresist film is used as a mask to dry-etch the silicon films 14 and 13 and the SOG film 12 over the N-type semiconductor regions 10 (sources and drains) of the memory cell selecting MISFETs. This etching is performed under conditions such that the etching rates of the silicon oxide films 14 and 13 and the SOG film 12 to the silicon nitride film 11 are large. In this way, the silicon nitride film 11 covering the N-type semiconductor regions 10 and the area over the element isolation groove 2 is not completely removed. Subsequently, the above-mentioned photoresist film is used as a mask to dry-etch and remove the silicon nitride film 11 and the gate oxide film 7 over the two N-type semiconductor regions 10 (source and drain) on each of the memory cell selecting MISFETs. In this way, a contact hole 15 is made over one of the N-type semiconductor regions 10 (source and drain), and a contact hole 16 is made over the other thereof. This etching is performed under conditions such that the etching rate of the silicon nitride film 11 to the silicon oxide film (the gate oxide film 7, and the silicon oxide film 4 inside the element isolation groove 2) is large. In this way, the N-type semiconductor regions 10 and the element isolation groove 2 are not deeply etched. This etching is also performed under conditions such that the silicon nitride film 11 is anisotropically etched, so that the silicon nitride film 11 remains on the side walls of the gate electrodes 8 (word lines WL). In this way, the contact holes 15 and 16 having a diameter finer than the resolution limit of photolithography are made in self-alignment to the gate electrode 8 (word line WL). In order to make the contact holes 15 and 16 in self-alignment to the gate electrode 8 (word line WL), it is allowable to etch the silicon nitride film 11 anisotropically in advance so as to form a side wall spacer on the side walls of the gate electrode 8 (word line WL).

Next, the photoresist is removed, and then dry etching residues, photoresist residues etc. on the substrate surface naked to the bottom of the contact holes 15 and 16 are removed with an etching solution such as a mixed solution of fluorinated acid and ammonium fluoride. At this time, the SOG film 12 naked to the side walls of the contact holes 15 and 16 are also exposed to the etching solution. However, the rate of etching the SOG film 12 with the fluorinated acid-based etching solution is decreased by the above-mentioned sintering at about 800° C.; therefore, the side walls of the contact holes 15 and 16 are not undercut very much by this wet etching treatment. In this way, it is possible to prevent surely a short circuit between plugs which will be embedded in the contact holes 15 and 16 in the next step.

Next, plugs 17 are formed inside the contact holes 15 and 16. The plugs 17 are formed by depositing a polysilicon film doped with an N-type impurity (such as P (phosphorus)) on the silicon oxide film 14 by CVD and then polishing this polycrystalline silicon film by CMP so as to cause the film to remain inside the contact holes 15 and 16.

Next, a silicon oxide film 18 having a film thickness of about 200 nm is deposited on the silicon oxide film 14, and then the semiconductor substrate 1 is heat-treated at about 800° C. The silicon oxide film 18 is deposited by plasma CVD using ozone ($O_3$) and tetraethoxysilane (TEOS) as source gases. By this heat treatment, the N-type impurity in the polycrystalline silicon film constituting the plugs 17 diffuses from the bottom of the contact holes 15 and 16 to the N-type semiconductor regions 10 (source and drain) of the memory cell selecting MISFET, so that the resistance of the N-type semiconductor regions 10 is made low.

Next, by dry etching using a photoresist film as a mask, the silicon oxide film 18 on the contact hole 15 is removed to make the surface of the plugs naked. The photoresist film is removed, and then bit lines BL are formed on the silicon oxide film 18. In order to form the bit lines BL, a Ti film having a film thickness of about 50 nm is first deposited on the silicon oxide film 18 by sputtering, and the semiconductor substrate 1 is heat-treated at about 800° C. Next, a TiN film having a film thickness of about 50 nm is deposited on the Ti film by sputtering. Furthermore, a W film having a film thickness of about 150 nm and a silicon nitride film 19 having a film thickness of about 200 nm are deposited thereon by CVD. Thereafter, a photoresist film is used as a mask to pattern these films. By the deposition of the Ti film on the silicon oxide film 18 and the subsequent heat treatment of the semiconductor substrate 1 at about 800° C., the Ti film reacts with the underlying Si so that a low-resistance $TiSi_2$ (titanium silicide) layer 20 is formed on the surface of the plugs 17. In this way, the contact resistance of the interconnections (bit lines BL) connected to the plugs 17 can be decreased. By making the bit lines BL into the lamination of the W film/the TiN film/the Ti film, the sheet resistance thereof can be decreased to 2 $\Omega/\Box$ or less; therefore, data-reading and -writing speeds can be improved. To decrease a parasite capacitance between the adjacent bit lines BL as much as possible to improve the data-reading and -writing speeds, the interval therebetween is made larger than the width thereof. The interval between the bit lines BL is set to, for example, about 0.12 $\mu$m, and the width is set to, for example, about 0.11 $\mu$m. The $TiSi_2$ layer 20 may be deteriorated by heat treatment. The heat treatment may be based on, for example, the step of forming a capacitor dielectric film of a data-storing capacitor element, which will be detailed later. As will be described later, however, the step of forming the capacitor dielectric film is performed at lower temperature in the present embodiment; therefore, it does not occur that the $TiSi_2$ layer 20 is deteriorated by any heat treatment so that inconveniences such as a rise in contact resistance are caused.

Next, a side wall spacer 21 is formed on the side walls of each of the bit lines BL. The sidewall spacer 21 is formed by depositing a silicon nitride film on the bit line BL by CVD and then etching this silicon nitride film anisotropically.

Next, an SOG film 22 having a film thickness of about 300 nm is applied onto the bit lines BL by spin coating. Next, the semiconductor substrate 1 is heat-treated at 800° C. for about 1 minute, to sinter the SOG film 22. The SOG film 22 has a higher reflow property than any BPSG film, and is superior in the capability of filling gaps between fine interconnections; therefore, it is possible to embed the SOG film satisfactorily in gaps between the bit lines BL made fine to a degree equivalent to the resolution limit of photolithography. The SOG film 22 can have a high reflow property even if high-temperature and long-term heat treatment, which is necessary for the BPSG. film, is not performed. It is therefore possible to suppress thermal diffusion of the impurities contained in the source and the drain of the memory cell selecting MISFETs below the bit lines BL to make the junction thereof shallow. Furthermore, the metal (W film) constituting the gate electrodes 8 (word lines WL) can be prevented from being deteriorated; therefore, the performances of the memory cells of the DRAM and the MISFETs constituting the peripheral circuit can be made high. The Ti film, the TiN film, and the W film, which constitute the bit lines BL, can be prevented from being deteriorated, so that the interconnection resistance can be decreased.

Next, a silicon oxide film 23 having a film thickness of about 600 nm is deposited on the SOG film 22, and then this silicon oxide film 23 is polished by CMP, to planarize the surface thereof. The silicon oxide film 23 is deposited, for example, by plasma CVD using ozone ($O_3$) and tetraethoxysilane (TEOS) as source gases. As described above, in the present embodiment, the SOG film 22, which has good planarization after the formation of the film, is applied onto the bit lines BL, and further the silicon oxide film 23 deposited thereon is planarized by CMP. This makes it possible to improve the capability of filling gaps between the bit lines BL and planarize the insulator film on the bit lines BL. Since no high-temperature and long-term heat treatment is performed, properties of the memory cells and the peripheral circuit can be prevented from being deteriorated, so that the performance thereof can be made high. Moreover, the resistance of the bit lines BL can be made low.

Next, a silicon oxide film 24 having a film thickness of about 100 nm is deposited on the silicon oxide film 23. This silicon oxide film 24 is deposited to repair fine injuries in the surface of the silicon oxide film 23, which are generated by the polishing based on the CMP. The silicon oxide film 24 is deposited, for example, by plasma CVD using ozone ($O_3$) and tetraethoxysilane (TEOS) as source gases.

Next, dry etching using a photoresist film as a mask is performed to remove the silicon oxide films 24 and 23, the SOG film 22, and the silicon oxide film 18 over the contact hole 16, thereby making a through hole 25 reaching the surface of the plug 17. This etching is performed under conditions such that the etching rate of the silicon nitride film to the silicon oxide films 24, 23 and 18, and the SOG film 22 is small. Thus, the silicon nitride film 19 over the bit line BL and the side wall spacer 21 are not deeply etched even if the matching of the through hole 25 with the bit line BL is out of position. In this way, the through hole 25 is formed in self-alignment to the bit line BL.

Next, the photoresist film is removed, and then dry etching residues, photoresist residues etc. on the surface of the plug 17 naked to the bottom of the through hole 25 are removed with an etching solution such as a mixed solution of fluorinated acid and ammonium fluoride. At this time, the SOG film 22 naked to the side walls of the through hole 25 is also exposed to the etching solution. However, the rate of etching the SOG film 22 with the fluorinated acid-based etching solution is decreased by the above-mentioned sintering at about 800° C.; therefore, the side walls of the through hole 25 are not undercut very much by this wet etching treatment. In this way, it is possible to prevent surely a short circuit between the bit line BL and a plug which will be embedded in the through hole 25 in the next step. Since the plug and the bit line BL can be sufficiently separated from each other, an increase in the parasite capacitance of the bit line BL can be suppressed.

Next, the plug 26, which is a barrier metal, is formed inside the through hole 25. The plug 26 is made of a metal compound film, for example, a titanium nitride film. The plug 26 can suppress reaction of the plug and a bottom electrode 29, which will be detailed later. This makes it possible to suppress the formation of a substance blocking electrical conductivity, such as silicon oxide, between the plug 17 and the plug 26 and keep connection between the data-storing capacitor element and the memory cell selecting MISFET satisfactory. The plug 26 is formed by depositing, for example, a titanium nitride film on the silicon oxide film 24 by sputtering or CVD and then etching-back this so as to cause the film to remain inside the through hole 25. Instead of the etching-back, the titanium nitride film may be polished and removed by CMP. The plug 26 may be made of, for example, tantalum nitride, titanium nitride to which aluminum is added, or tantalum nitride to which silicon is added, instead of the above-mentioned metal compound film, such as the titanium nitride film.

Thereafter, a silicon nitride film 27 and an insulator film 28 are formed, and a hole is made in the silicon nitride film 27 and the insulator film 28 in such a manner that the plug 26 is made naked. The insulator film 28 is formed, for example, by plasma CVD using ozone ($O_3$) and tetraethoxysilane (TEOS) as source gases. The hole is worked by etching using a photoresist film as a mask.

Next, a bottom electrode 29 made of ruthenium is deposited. First, a ruthenium film having a film thickness of 50 nm is deposited over the whole surface of the semiconductor substrate 1. Sputtering is insufficient for step coverage. Thus, only ruthenium layer having a thickness of several nanometers is formed inside the hole. The ruthenium film by the sputtering is used as a seed layer to deposit a ruthenium film having a film thickness of 20 nm over the whole surface of the semiconductor substrate 1 by CVD. The ruthenium film by the CVD is formed by liquid-transferring a solution wherein an organic metal complex $Ru(C_2H_4C_2H_5)_2$ (bisethylcyclopentadienylruthenium) is dissolved in $(C_2H_4)_2O$ (tetrahydrofuran) at a concentration of 0.1 mol/L. In a shower head facing the substrate, the liquid ingredient is mixed with oxygen gas and nitrogen gas and then the mixture is sprayed onto the substrate. The temperature for the formation is 290° C. and the pressure is 5 Torr. To prevent deformation of the ruthenium film by subsequent heat treatment, it is desired to sinter the ruthenium film. Specifically, the ruthenium film is heat-treated at 700° C. in the atmosphere of an inert gas such as argon for 1 minute. The heat treatment temperature is desirably a temperature that is slightly higher than the crystallization temperature of the dielectric oxide film.

Next, an insulator film (not illustrated) is deposited over the whole surface of the semiconductor substrate 1. The insulator film is preferably made into an SOG film, considering the capability of being embedded in the hole and the etching selectivity of the insulator film 28. At this time, the ruthenium film on the insulator film 28 other than the ruthenium film inside the hole is removed. For this removal, an etch-back process or a CMP process may be used. The insulator film remaining inside the hole, which is not illustrated, can be removed by wet etching. In this way, the bottom electrode 29 made of ruthenium is formed. The film constituting the bottom electrode 29 may be a platinum or copper film instead of the ruthenium film.

Next, a niobium pentoxide film 30 having a film thickness of 5 nm or less is deposited over the whole surface of the semiconductor substrate 1. The reason why the film thickness is set to 5 nm or less is to attain a decrease in leakage current by an improvement in the density of the film, an improvement in the morphology, and an improvement in the efficiency of removing residue carbon in the film at the time of oxidation treatment. The deposition of the niobium pentoxide film 30 can be attained by thermal CVD at 550° C. or less under a reduced pressure (for example, 400 mTorr) using, for example, a gas containing pentaethoxy niobium ($Nb(C_2H_5O)_5$) as a source gas. The film 30 can also be formed by atomic layer CVD for supplying pentaethoxy niobium and an oxidizer (for example, $H_2O$) alternately.

Next, the niobium pentoxide film 30 is heat-treated to be crystallized. The heat treatment is performed at a temperature of 700° C. or less. The reason why the heat treatment temperature is set to 700° C. or less is to suppress the oxidation of the bottom electrode and the barrier metal to such a degree that no problem is caused if the temperature is 700° C. or less. It is sufficient that this heat treatment temperature is a temperature at which the niobium pentoxide film is crystallized. In order to make the niobium pentoxide film into a good polycrystalline form, it is desired that the temperature is 500° C. or more. The atmosphere for the heat treatment may be an oxidizing atmosphere or an inert gas atmosphere. For example, conditions for the heat treatment are as follows: the atmosphere: oxygen, dinitrogen oxide, argon or nitrogen, the treatment temperature: 500 to 700° C., and the treatment time: 1 to 10 minutes.

Next, a tantalum pentoxide film 31 having a film thickness of 5 nm or less is deposited on the niobium pentoxide film 30. The deposition of the tantalum pentoxide film 31 can be attained by thermal CVD at 550° C. or less under a reduced pressure (for example, 400 mTorr) using, for example, a gas containing pentaethoxy tantalum ($Ta(C_2H_5O)_5$) as a source gas. The film 31 can also be formed by atomic layer CVD for supplying pentaethoxy tantalum and an oxidizer (for example, $H_2O$) alternately.

Next, the tantalum pentoxide film 31 is heat-treated to be crystallized. The heat treatment is performed at a temperature of 700° C. or less. It is sufficient that this heat treatment temperature is a temperature at which the tantalum pentoxide film on the niobium pentoxide film is crystallized. In order to make the tantalum pentoxide film into a good polycrystalline form, it is desired that the temperature is 500° C. or more. The atmosphere for the heat treatment may be an oxidizing atmosphere or an inert gas atmosphere. For example, conditions for the heat treatment are as follows: the treatment temperature: 500 to 700° C., the atmosphere: oxygen, dinitrogen oxide, argon or nitrogen, and the treatment time: 1 to 10 minutes. However, in the case that the crystallization treatment is performed in an inert gas atmosphere, in order to repair oxygen vacancy introduced into the niobium pentoxide film 30 and the tantalum pentoxide film 31, it is necessary to combine the crystallization treatment with heat treatment in an oxidizing atmosphere. Since this treatment in the oxidizing atmosphere is not for crystallizing the tantalum pentoxide film 31, the temperature may be 500° C. or less. For example, conditions for the treatment are as follows: the atmosphere: ozone, and the treatment temperature: about 400° C.

Since the tantalum pentoxide film is formed on the polycrystallized niobium pentoxide film and then the resultant is heat-treated as described above, the crystallization temperature of the tantalum pentoxide film can be made lower and simultaneously a high dielectric constant can be realized. The conduction mechanism of leakage current is reinforced by the tantalum pentoxide film; therefore, the leakage current property the layered film of the tantalum pentoxide film and the niobium pentoxide film becomes substantially equivalent to that of a tantalum pentoxide single-layered film.

Next, a titanium nitride film is deposited on the tantalum pentoxide film 31, and a photoresist film is formed on the titanium nitride film. This photoresist film is used as a mask to etch the titanium nitride film, the tantalum pentoxide film 31, and the niobium pentoxide film 30, thereby forming a capacitor dielectric film and a top electrode 32. For the deposition of the titanium nitride film, for example, CVD is used. Considering a technical theme for the CVD that the top electrode must be formed in a narrow portion of the concave-type capacitor dielectric film, the top electrode is made of titanium nitride in the present embodiment. The material for constituting the top electrode 32 is not necessarily titanium nitride. Instead of the titanium nitride film, a tungsten film or a ruthenium film may be used. In the case that the top electrode is made of ruthenium, the top electrode can be formed under the same conditions as for the bottom electrode 29.

As described above, there is formed a data-storing capacitor element composed of the bottom electrode 29 made of ruthenium, the capacitor dielectric film made of the layered film composed of the niobium pentoxide film 30 and the tantalum pentoxide film 31, and the top electrode 32 made of titanium nitride. This data-storing capacitor element and the memory cell selecting MISFET connected thereto in series constitute a memory cell in a DRAM.

Next, the photoresist film is removed, and then a silicon oxide film 33 having a film thickness of about 40 nm is deposited on the data-storing capacitor element. The silicon oxide film 33 is formed, for example, by plasma CVD using ozone ($O_3$) and tetraethoxysilane (TEOS) as source gases. Furthermore, an SOG film 34 is applied thereto to make the region where the memory cell is formed flat. At the same time, a step between the region and the peripheral circuit region is decreased.

Next, by dry etching using a photoresist film as a mask, the SOG film 34 and the silicon oxide film 33 are removed to form a through hole. Thereafter, a plug 35 is formed inside the through hole. Subsequently, a second layer interconnection 36 is formed. The plug 35 is formed by depositing a TiN film having a film thickness of about 100 nm on the SOG film 34 by sputtering, depositing a W film having a film thickness of about 500 nm thereon by CVD, and etching-back these films so as to cause some parts of the films to remain inside the through holes. The second layer interconnection 36 is formed by depositing a TiN film having a film thickness of about 50 nm, an Al (aluminum) film having a film thickness of about 500 nm, and a Ti film having a film thickness of about 50 nm over the SOG film 34 by sputtering; and then patterning these films by dry etching using a photoresist film as a mask.

Thereafter, an interlayer dielectric is formed thereon, and then a third layer interconnection is formed thereon. A passivation film composed of a silicon oxide film and a silicon nitride film is deposited thereon. The illustrating of these films is omitted. The third layer interconnection and a plug connected thereto can be formed in the same manner as in the case of the second layer interconnection. The interlayer dielectric may be made of a silicon oxide film having a film thickness of about 300 nm, an SOG film having a film thickness of about 400 nm, or a silicon oxide film having a film thickness of about 300 nm. The silicon oxide film can be deposited, for example, by plasma CVD using ozone ($O_3$) and tetraethoxysilane (TEOS) as source gases.

Through the above-mentioned steps, the DRAM of the present embodiment is substantially completed.

According to Embodiment 1, the capacitor dielectric film is made into the layered film composed of the niobium pentoxide film 30 and the tantalum pentoxide film 31; therefore, the crystallization temperature of the capacitor dielectric film can be made low and poor conductivity based on the oxidation of the plug 26 can be avoided. Moreover, a high dielectric constant of the niobium pentoxide film 30 makes it possible to increase the accumulated electric charge quantity of the data-storing capacitor element. A high insulating property of the tantalum pentoxide film 31 makes it possible to decrease leakage current between the top electrode 32 and the bottom electrode 29 and improve the refreshing property of the DRAM. As a result, the film quality of the capacitor dielectric film can be made good as a whole, and the performance and reliability of the DRAM can be improved.

In the above-mentioned example, the capacitor dielectric film is made into the layered film composed of the niobium pentoxide film 30 and the tantalum pentoxide film 31. However, about the components of the layered film, the film made of pure tantalum pentoxide and the film made of pure niobium pentoxide are not necessarily used. In the case that the upper layer and the lower layer are represented by $(Ta_{1-x}Nb_x)_2O_5/(Ta_{1-y}Nb_y)_2O_5$, components satisfying the relationship of $x<y$ may be used. In other words, a layered film wherein the ratio of Nb/Ta of a lower insulator film is larger than the ratio of Nb/Ta of an upper insulator film may be used. In such a layered film, the crystallization temperature of a solid solution of niobium pentoxide and tantalum pentoxide of the upper layer is affected by crystal structure of the underlying film made of the composition of niobium pentoxide and tantalum pentoxide, so that the crystallization temperature is made low. The film made of the composition of niobium pentoxide and tantalum pentoxide, as the upper layer, also makes it possible to keep the leakage current density small.

In the above-mentioned process, the tantalum pentoxide film having a film thickness of 5 nm or less and the niobium pentoxide film having a film thickness of 5 nm or less are formed at two stages. However, a process which can be used is not limited to this formation-process. For example, paying attention to the effect of a decrease in leakage current under the condition that the total film thickness of the capacitor dielectric film is constant, a tantalum pentoxide film having a film thickness of more than 5 nm for decreasing leakage current may be formed on an underlying niobium pentoxide film having a film thickness of 5 nm or less for decreasing the crystallization temperature of the dielectric film. Paying attention to the effect of making the dielectric constant high, a tantalum pentoxide film having a film thickness of 5 nm or less for decreasing leakage current may be formed on a niobium pentoxide film having a film thickness of more than 5 nm.

The dielectric film may not be necessarily formed at two stages. By forming the dielectric film at three or more stages, the density of each of the formed layers is made larger and the morphology thereof is improved. Additionally, residual carbon in the film is easily released at the time of oxidation treatment, and leakage current is also decreased. However, as the number of the stages for the formation is larger, costs for the process are larger. It is therefore desired to set the number of the stages to three or less.

The present invention is not limited to the above-mentioned embodiment. Needless to say, various means described in the column "Summary of the Invention" can be used.

Embodiment 2

Figure 2:
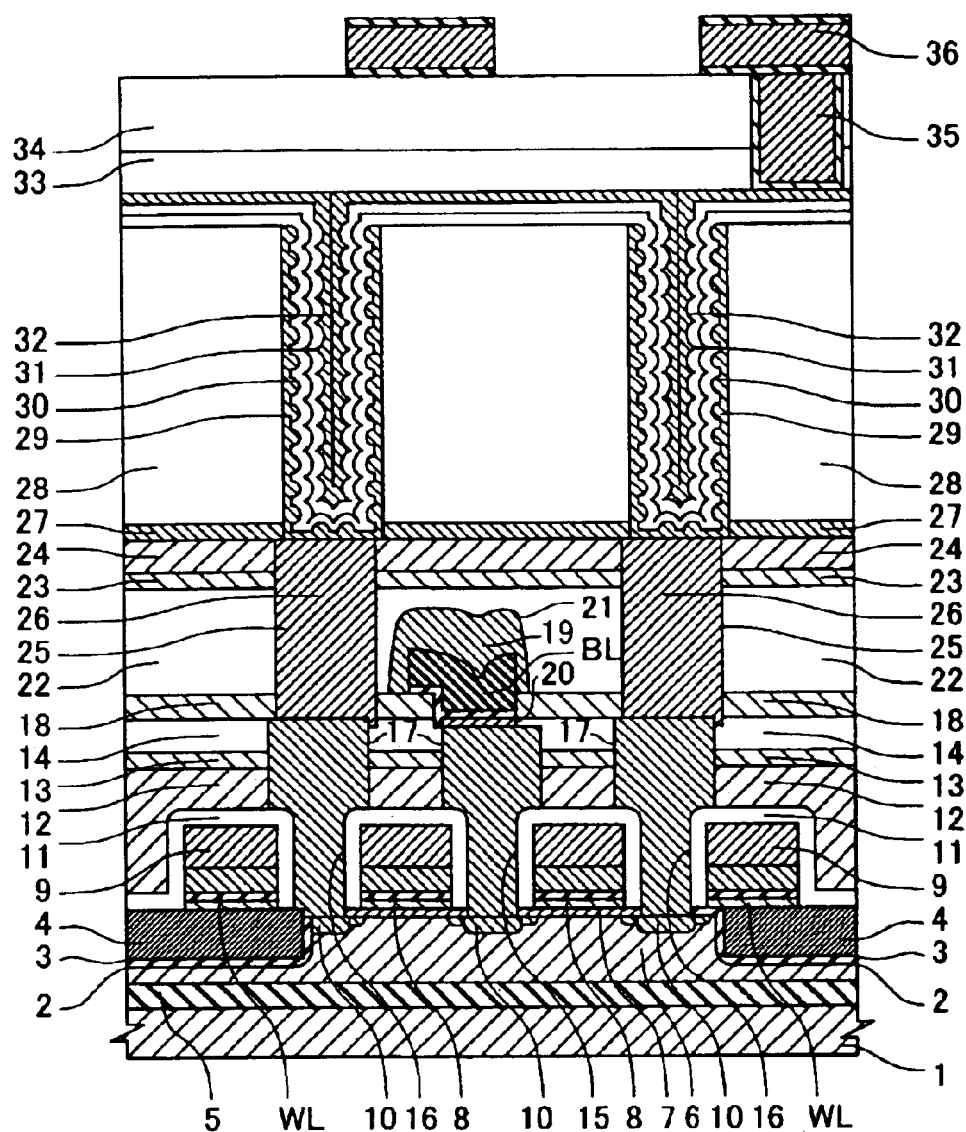
FIG. 2 is a vertical sectional view of a step for explaining Embodiment 2 of the present invention.

Embodiment 2 of the present invention will be described, referring to FIG. 2. This is an embodiment wherein an MIS capacitor using a dielectric film made of a layered film composed of a niobium pentoxide film and a tantalum pentoxide film is applied to a semiconductor memory device, in particular, such a DRAM.

The DRAM of the present embodiment is the same as in Embodiment 1 except differences in data-storing capacitor element structure. Accordingly, only the differences will be described hereinafter, and description on the same matters is omitted.

The process for producing the DRAM of Embodiment 2 is the same as in Embodiment 1 about the steps before the plug 26 is formed inside the through hole 25. In Embodiment 2, the plug 26 is formed by depositing a polycrystalline silicon film doped with an N-type impurity (such as P (phosphorus)) by CVD and then etching-back this polycrystalline silicon film so as to cause some parts thereof to remain inside the through hole 25. Instead of the etching-back, the polycrystalline silicon film may be polished and removed by CMP.

Thereafter, a silicon nitride film 27 and an insulator film 28 are formed in the same way as in Embodiment 1, and a hole is made in the silicon nitride film 27 and the insulator film 28 so that the plug 26 is made naked.

Next, a conductive amorphous silicon layer having a film thickness 20 nm is formed over the inner face of the hole and the upper face of the insulator film 28. By photolithography and dry etching, the amorphous silicon layer on the insulator film 28 is removed to remain only on the inner face of the hole. The inner face of the hole is seeded with silicon, and then heat-treated at 630° C. to be crystallized. At the same time, the surface is made rugged to form a bottom electrode 29 made of polycrystalline silicon.

Next, $PH_3$ is used to dope the surface of the bottom electrode 29 made of polycrystalline silicon with P. Thereafter, the resultant is heat-treated with $NH_3$ to form a silicon nitride film on the surface. The film has a very thin, that is, about 2 nm. Thus, the film is not illustrated in FIG. 2. This silicon nitride film has an effect of suppressing the oxidation of polycrystalline silicon of the bottom electrode when the insulator film is formed and heat-treated.

Next, a niobium pentoxide film 30 is formed over the whole surface of the semiconductor substrate 1. The deposition of the niobium pentoxide film 30 is performed in the same way as in Embodiment 1. Furthermore, the niobium pentoxide film 30 is heat-treated in the same way as in Embodiment 1, so as to be crystallized.

Next, a tantalum pentoxide film 31 is deposited on the niobium pentoxide film 30. The deposition of the tantalum pentoxide film 31 is performed in the same way as in Embodiment 1. Furthermore, the tantalum pentoxide film 31 is heat-treated in the same way as in Embodiment 1, so as to be crystallized.

Subsequent steps are substantially the same as in Embodiment 1.

According to Embodiment 2, the capacitor dielectric film is made into the layered film composed of the niobium pentoxide film 30 and the tantalum pentoxide film 31; therefore, the heat treatment temperature required for crystallization of the capacitor dielectric film can be made low and a decrease in the capacitance based on the oxidation of the bottom electrode 29 made of polycrystalline silicon can be avoided. Moreover, a high dielectric constant of the niobium pentoxide film makes it possible to increase the accumulated electric charge quantity of the data-storing capacitor element. A high insulating property of the tantalum pentoxide film makes it possible to decrease leakage current between the top electrode 32 and the bottom electrode 29 and improve the refreshing property of the DRAM. As a result, the film quality of the capacitor dielectric film can be made good as a whole, and the performance and reliability of the DRAM can be improved.

In the above-mentioned example, the capacitor dielectric film is made into the layered film composed of the niobium pentoxide film 30 and the tantalum pentoxide film 31. However, about the components of the layered film, the film made of pure tantalum pentoxide and the film made of pure niobium pentoxide may not be necessarily used. In the case that the upper layer and the lower layer are represented by $(Ta_{1-x}Nb_x)_2O_5(Ta_{1-y}Nb_y)_2O_5$, components satisfying the relationship of x<y may be used. In other words, a layered film wherein the ratio of Nb/Ta of a lower insulator film is larger than the ratio of Nb/Ta of an upper insulator film may be used. In such a layered film, the crystallization temperature of a solid solution of niobium pentoxide and tantalum pentoxide of the upper layer is affected by crystal structure of the underlying film made of the composition of niobium pentoxide and tantalum pentoxide, so that the crystallization temperature is made low. The film made of the composition of niobium pentoxide and tantalum pentoxide, as the upper layer, also makes it possible to keep the leakage current density small.

In the above-mentioned process, the tantalum pentoxide film having a film thickness of 5 nm or less and the niobium pentoxide film having a film thickness of 5 nm or less are formed at two stages. However, a process which can be used is not limited to this forming process. For example, paying attention to the effect of a decrease in leakage current under the condition that the total film thickness of the capacitor dielectric film is constant, a tantalum pentoxide film having a film thickness of more than 5 nm for decreasing leakage current may be formed on an underlying niobium pentoxide film having a film thickness of 5 nm or less for decreasing the crystallization temperature of the dielectric film. Paying attention to the effect of making the dielectric constant high, a tantalum pentoxide film having a film thickness of 5 nm or less for decreasing leakage current may be formed on a niobium pentoxide film having a film thickness of more than 5 nm.

The dielectric film may not be necessarily formed at two stages. By forming the dielectric film at three or more stages, the density of each of the formed layers is made larger and the morphology thereof is improved. Additionally, residual carbon in the film is easily released at the time of oxidation treatment and leakage current is also decreased. However, as the number of the stages for the formation is larger, costs for the process are larger. It is therefore desired to set the number of the stages to three or less.

The present invention is not limited to the above-mentioned embodiment. Needless to say, various means described in the column "Summary of the Invention" can be used.

Embodiment 3

Figure 3:
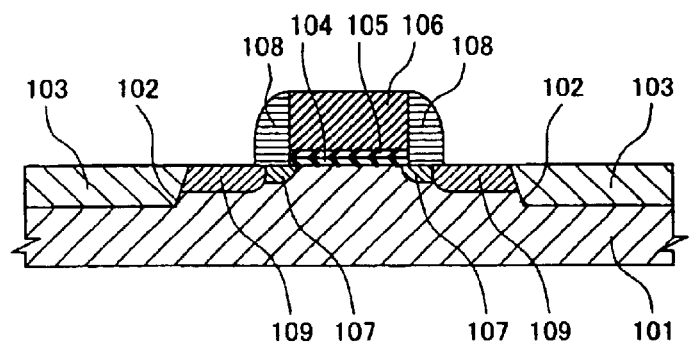
FIG. 3 is a vertical sectional view of a step for explaining Embodiment 3 of the present invention.

FIG. 3 is a sectional view of a MISFET which is a semiconductor device of Embodiment 3. This is an example wherein a dielectric film made of a layered film composed of a niobium pentoxide film and a tantalum pentoxide film is used as a gate insulator film of the MISFET.

First, a semiconductor substrate 101, which is the same as the semiconductor substrate 1 in Embodiment 1, is prepared, and a groove 102 of an isolation element region is made in a main face of the semiconductor substrate 101 and a silicon oxide film 103 is formed inside the groove 102. The formation of the groove 102 and the silicon oxide film 103 is performed in the same way as the formation of the groove 2 and the silicon oxide film 4 in Embodiment 1.

Next, niobium pentoxide is deposited on the whole surface of the semiconductor substrate 101, and then crystallized to form a niobium pentoxide film 104. Furthermore, a tantalum pentoxide film is deposited on the niobium pentoxide film 104, and crystallized to form a tantalum pentoxide film 105. The deposition and the crystallization of the niobium pentoxide are the same as in the step of forming the niobium pentoxide film 30 in Embodiment 1. The deposition and the crystallization of the tantalum pentoxide are the same as in the step of forming the tantalum pentoxide film 31 in Embodiment 1. The niobium pentoxide film 104 and the tantalum pentoxide film 105 will be a gate insulator film of a MISFET, which will be described below.

Next, polycrystalline silicon is deposited on the tantalum pentoxide film 105. A photoresist film is used as a mask to etch and remove this polycrystalline silicon film, the tantalum pentoxide film 105 and the niobium pentoxide film 104, thereby forming a gate electrode 106 made of the polycrystalline silicon film, and the above-mentioned gate insulator film composed of the layered film of the niobium pentoxide film 104 and the tantalum pentoxide film 105.

Next, the photoresist film and the gate electrode 106 are used as a mask to ion-implant an impurity at a low concentration, thereby forming a semiconductor region 107. A silicon nitride film and a silicon oxide film are formed on the whole surface, and anisotropically etched to form a side wall spacer 108 on side walls of the gate electrode 106. Furthermore, the photoresist film, the gate electrode 106, and the side wall spacer 108 are used as masks to ion-implant an impurity at a high concentration, thereby forming a semiconductor region 109. The semiconductor regions 107 and 109 constitute source and drain regions of the so-called LDD structure.

As described above, a MISFET is formed. Thereafter, an interlayer dielectric is formed and a first layer interconnection contacting the semiconductor region 109 is formed. Furthermore, an interlayer dielectric is formed and an upper layer interconnection is formed on the interlayer dielectric. These are equivalent to the first layer interconnection and so on in Embodiment 1, and description thereof is omitted.

In the above-mentioned embodiment, polycrystalline silicon is used for the gate electrode 106. However, the material for the electrode 106 is not limited thereto, and a metal electrode made of titanium nitride, tungsten, tungsten nitride, or the like can be used.

Before the formation of the niobium pentoxide film 104, a silicon nitride film may be formed on the surface of the semiconductor substrate 101. For example, the surface is heat-treated with $NH_3$ to form the silicon nitride film on the surface. This silicon nitride film has an effect of suppressing the oxidation of polycrystalline silicon as a channel region when the dielectric film is formed and heat-treated.

According to Embodiment 3, the gate insulator film is made into the layered film composed of the niobium pentoxide film 104 and the tantalum pentoxide film 105; therefore, the crystallization temperature for the gate insulator film can be made low and the oxidation of the silicon substrate 101 can be avoided.

Since a high dielectric constant of the niobium pentoxide film makes it possible to increase the capacitance of the gate insulator film, the film thickness of the gate insulator film can be made large to decrease leakage current. That is, in order that a conventional silicon oxide film can realize the maintenance of characteristics of transistors of a semiconductor device when circuits thereof are integrated to a high degree, it is essential to make the film thickness thereof small to keep the capacitance thereof. Thus, tunnel current increases. However, when the gate insulator film made of the layered film composed of the niobium pentoxide film 104 and the tantalum pentoxide film 105 is used, the film thickness thereof can be made large for the same capacitance. Accordingly, a MISFET wherein tunnel current is less generated can be realized.

The portion wherein the gate insulator film is sandwiched between the substrate and the gate constitutes a capacitor having the so-called MIS structure. To this portion is applied each of capacitors, whereby advantageous effects of each of the capacitors can be produced.

In the present embodiment, the tantalum pentoxide film and the niobium pentoxide film are formed at two stages. However, by forming the films at three or more stages to make the film thickness thereof small, the density of each of the formed layers is made larger and the morphology thereof is improved. Additionally, residual carbon in the film is easily released at the time of oxidation treatment, and leakage current is also decreased. However, as the number of the stages for the formation is larger, costs for the process are larger. It is therefore desired to set the number of the stages to three or less.

Paying attention to the effect of a decrease in leakage current under the condition that the total film thickness of the capacitor dielectric film is constant, a tantalum pentoxide film having a film thickness of more than 5 nm for decreasing leakage current may be formed on an underlying niobium pentoxide film having a film thickness of 5 nm or less for decreasing the crystallization temperature of the dielectric film. Paying attention to the effect of making the dielectric constant high, a tantalum pentoxide film having a film thickness of 5 nm or less for decreasing leakage current may be formed on a niobium pentoxide film having a film thickness of more than 5 nm.

The present invention is not limited to the above-mentioned embodiment. Needless to say, various means described in the column "Summary of the Invention" can be used.

Embodiment 4

Figure 4:
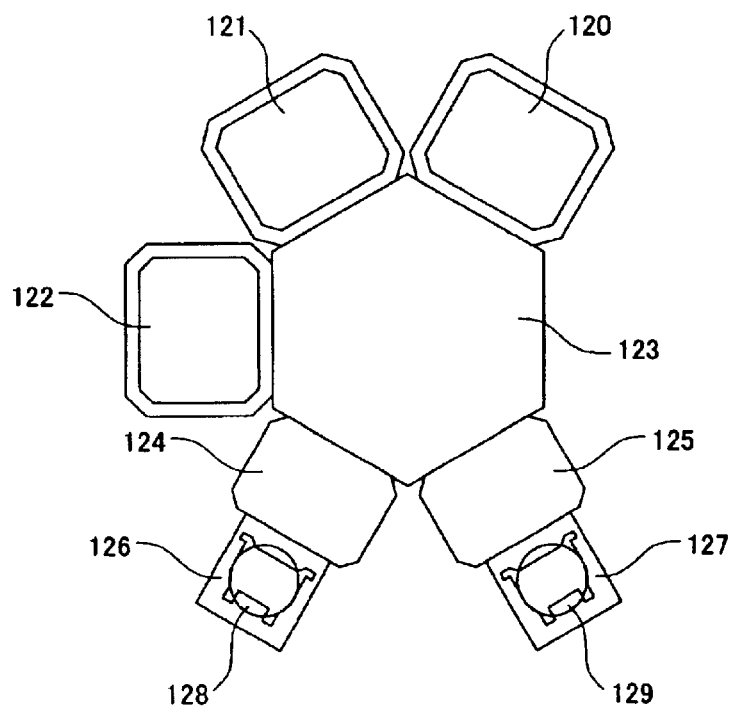
FIG. 4 is a vertical sectional view of a step for explaining Embodiment 4 of the present invention.

FIG. 4 is a sectional view of a semiconductor-producing equipment of Embodiment 4.

The producing equipment of the present embodiment has a first reaction chamber 120 for forming a niobium pentoxide film, a second reaction chamber 121 for forming a tantalum pentoxide film, and a third chamber 122 for heat-treating the niobium pentoxide film and the tantalum pentoxide film. The first, second, and third reaction chambers 120, 121, and 122 are connected to a vacuum transportation chamber 123 through gate valves. The gate valves are not illustrated.

Each of the first, second, and third reaction chambers 120, 121, and 122 is provided with a substrate heating mechanism and a gas supplying mechanism. The gas supplying mechanism of the first chamber 120 has a means for supplying source gases for forming the niobium pentoxide film by CVD. The gas supplying mechanism of the second chamber 121 has a means for supplying source gases for forming the tantalum pentoxide film by CVD. The gas supplying mechanism of the third reaction chamber 122 has a means for supplying an inert gas and an oxidizing gas such as oxygen, dinitrogen oxide, or ozone.

Road lock chambers 124 and 125 are connected to the vacuum transportation chamber 123 through non-illustrated gate valves. Cassette chambers 126 and 127 are connected to the road lock chambers 124 and 125, respectively. Wafers 128 and 129 held by wafer cassettes are set in the cassette chambers 126 and 127, respectively.

The wafer 128 is introduced from the cassette chamber 126 through the road lock chamber 124 to the vacuum transportation chamber 123. At this time, the road lock chamber 124 is degassed so that the atmosphere does not enter the vacuum transportation chamber 123. Thus, the cleanness of the vacuum transportation chamber 123, and the first, second and third reaction chambers 120, 121 and 122 is kept high.

The wafer 128 introduced into the vacuum transportation chamber 123 is transported into the first reaction chamber 120 to deposit niobium pentoxide thereon as described Embodiments 1 to 3. Thereafter, the wafer 128 is transported from the first reaction chamber 120 through the vacuum transportation chamber 123 to the third reaction chamber 122. In the third reaction chamber 122, the wafer 128 is heat-treated as described in Embodiment 1 to 3, so that the niobium pentoxide film is crystallized.

Next, the wafer 128 is transported from the third reaction chamber 122 through the vacuum transportation chamber 123 to the second reaction chamber 121. Tantalum pentoxide is deposited on the wafer 128 transported to the second reaction chamber 121, as described Embodiments 1 to 3. Thereafter, the wafer 128 is transported from the second reaction chamber 121 through the vacuum transportation chamber 123 to the third reaction chamber 122. In the third reaction chamber 122, the wafer 128 is heat-treated as described in Embodiment 1 to 3, so that the tantalum pentoxide film is crystallized.

The wafer 128 having the crystallized tantalum pentoxide film is transported from the vacuum transportation chamber 123 through the road lock chamber 125 to the cassette chamber 127 so as to be held as the wafer 129 by the wafer cassette.

Through the above-mentioned steps, a layered film composed of polycrystallized niobium pentoxide and polycrystallized tantalum pentoxide is formed. During this time, the wafer 128 is moved through the vacuum transportation chamber 123, the vacuum degree of which is kept high. Thus, the interfaces of the niobium pentoxide film and so on are kept clean so that the formed crystal films are made to have high quality. In other words, particles such as impurities, dusts and so on in the atmosphere generally promote abnormal crystallization of the niobium pentoxide film and the tantalum pentoxide film, or the like, so that unpreferable defects may be generated; however, when the producing equipment of the present embodiment is used, it is possible to realize continuous steps of film-formation and crystallization in high vacuum environment making it possible to give a high cleanness.

According to Embodiment 4, a layered film which has a good-quality polycrystalline structure and is composed of a niobium pentoxide film and a tantalum pentoxide film can be formed, and the performance and reliability of a DRAM using this layered film can be improved. Moreover, the performance and reliability of a MISFET using this layered film as a gate dielectric film can be improved.

The vacuum transportation chamber 123 in the above-mentioned example may have a fourth reaction chamber. In this fourth reaction chamber, nitriding treatment for forming the silicon nitride film described in Embodiment 2 or 3 can be performed. This nitriding treatment is performed before the treatment in the first reaction chamber 120.

The vacuum transportation chamber 123 may have a fifth reaction chamber. In this fifth reaction chamber, the titanium nitride constituting the top electrode and the other conductive films which are described in Embodiments 1 to 3 may be deposited. The deposition of the conductive films is performed after the treatment in the third reaction chamber 122. According to Embodiment 4, the cleanness of the niobium pentoxide film and the tantalum pentoxide film which constitute the layered film can be kept, and the withstand voltage of the dielectric film can be improved so that the performance and reliability of the semiconductor device can be improved. Additionally, throughput in the production can be improved.

The formation of the niobium pentoxide film and the tantalum pentoxide film may be performed in a single reaction chamber. In this case, for example, the gas supplying mechanism of the first reaction chamber 120 has both of a means for supplying source gases for forming the niobium pentoxide film by CVD and a means for supplying source gases for forming the tantalum pentoxide film by CVD. The niobium pentoxide film is crystallized in the third reaction chamber 122, and then the resultant is again transported through the vacuum transportation chamber 123 to the first reaction chamber 120 so as to deposit the tantalum pentoxide film. Thereafter, the resultant is transported through the vacuum transportation chamber 123 to the third reaction chamber 122, and the tantalum pentoxide film is crystallized.

According to this process, niobium pentoxide and tantalum pentoxide can be deposited in the same reaction chamber; therefore, costs for the semiconductor-producing equipment can be reduced so that costs for a semiconductor device produced using this semiconductor-producing equipment can be reduced.

The above-mentioned example is concerned with an example of the production of a capacitor having a layered film composed of a tantalum pentoxide film and a niobium pentoxide film. A layered film made of niobium pentoxide, or a layered film made of a composition of tantalum pentoxide and niobium pentoxide can be produced.

In the case that dielectric films are laminated using the same source gases, for example, in the case that niobium pentoxide is made into a lamination by the second aspect of the present invention, two reaction chambers are unnecessary and further it is unnecessary to handle different source gases. Thus, the costs become lower. Costs for the process for forming a layered film composed of films made of a composition of tantalum pentoxide and niobium pentoxide also become lower. The cocktail material of pentaethoxy tantalum and pentaethoxy niobium is more difficult to handle than a raw material made only of pentaethoxy niobium because of mixing-operation thereof, and so on. However, this process is easier than the process for producing a layered film from source gases for forming different two compounds.

The present invention is not limited to the above-mentioned embodiment. Needless to say, various means described in the column "Summary of the Invention" can be used.

Embodiment 5

Embodiment 5 of the present invention will be described, referring to FIG. 5, which show an MIM capacitor using a dielectric film made of a layered film of niobium pentoxide. For example, this MIM capacitor can be applied to the capacitor of the semiconductor memory device, in particular, DRAM shown in FIG. 1. A bottom electrode 206, a niobium pentoxide film 207, a niobium pentoxide film 208, and a top electrode 209 in FIG. 5 correspond to the bottom electrode 29, the niobium pentoxide film 30, the tantalum pentoxide film 31, and the top electrode 32 in FIG. 1, respectively.

Figure 5A:
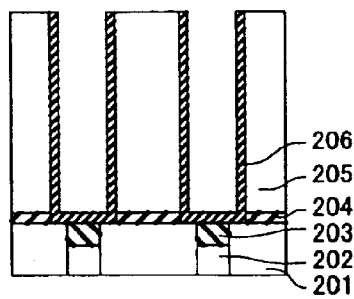
FIGS. 5A to 5D are vertical sectionals views of steps for explaining Embodiment 5 of the present invention.

First, a process from the initial to the formation of the bottom electrode will be described, referring to FIG. 5A. A plug 203, which is a barrier metal, is formed inside a plug-region interlayer dielectric 201 made of a silicon oxide film. The plug 203 is necessary for suppressing reaction of the bottom electrode 206 with a plug 202 made of polycrystalline silicon. This makes it possible to suppress the formation of a material blocking electrical conductivity, for example, silicon oxide between the plugs 203 and 202 and keep connection between a data-storing capacitor element and a memory cell selecting MISFET satisfactorily. The plug 203 is formed by depositing, for example, a titanium nitride film over the plug-region interlayer dielectric 201 and the plug 202 by sputtering or CVD, and then etching-back this to cause some portions thereof to remain over the plug 202. Instead of the etching-back, the titanium nitride film may be polished by CMP. The plug 203 may be made of tantalum nitride, titanium nitride to which aluminum is added, tantalum nitride to which silicon is added, or the like instead of the metal compound such as titanium nitride.

A silicon nitride film 204 and a capacitor-region interlayer dielectric 205 made of a silicon oxide film are formed, and a hole is made in the capacitor-region interlayer dielectric 205 and the silicon nitride film 204 so that the plug 203 is made naked. The capacitor-region interlayer dielectric 205 is formed by plasma CVD using ozone ($O_3$) and tetraethoxysilane (TEOS) as source gases. The hole is worked by etching using a photoresist film as a mask.

Next, a bottom electrode 206 made of ruthenium is deposited. First, a ruthenium film having a film thickness of 50 nm is deposited over the whole surface of the substrate by sputtering. Sputtering is insufficient for step coverage. Thus, only ruthenium layer having a thickness of several nanometers is formed inside the hole. The ruthenium film by the sputtering is used as a seed layer to deposit a ruthenium film having a film thickness of 20 nm over the whole surface of the semiconductor substrate 1 by CVD. The ruthenium film by the CVD is formed by liquid-transferring a solution wherein an organic metal complex $Ru(C_2H_4C_2H_5)_2$ (bisethylcyclopentadienylruthenium) is dissolved in $(C_2H_4)_2 O$ (tetrahydrofuran) at a concentration of 0.1 mol/L. In a shower head facing the substrate, the liquid ingredient is mixed with oxygen gas and nitrogen gas and then the mixture is sprayed onto the substrate. The temperature for the formation is 290° C. and the pressure is 5 Torr. To prevent deformation of the ruthenium film by subsequent heat treatment, it is desired to sinter the ruthenium film. Specifically, it is advisable that the ruthenium film is heat-treated at 700° C. in the atmosphere of an inert gas such as argon for 1 minute.

Next, an insulator film (not illustrated) is deposited over the whole surface of the semiconductor substrate. The insulator film is preferably made into an SOG film, considering the capability of being embedded in the hole and the etching selectivity between this insulator film and the capacitor-region interlayer dielectric 205. At this time, the ruthenium film on the capacitor-region interlayer dielectric 205 other than the film 205 inside the hole is removed. For this removal, an etch-back process or a CMP process may be used. The insulator film (not illustrated) remaining inside the hole can be removed by wet etching. In this way, the bottom electrode 206 made of ruthenium is formed (FIG. 5A).

Figure 5B:
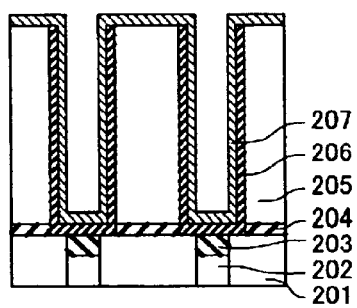

Next, a niobium pentoxide film 207 having a film thickness of 5 nm or less is deposited over the whole surface of the semiconductor substrate (FIG. 5B). The deposition of the niobium pentoxide film 207 can be attained by CVD at 500° C. or less under a reduced pressure (for example, 400 mTorr) using, for example, a gas containing pentaethoxy niobium ($Nb(C_2H_5O)_5$) as a source gas. The film 207 can also be formed by atomic layer CVD for supplying pentaethoxy niobium and an oxidizer (for example, $H_2O$) alternately.

Since niobium pentoxide has a low crystallization temperature, the niobium pentoxide film is partially crystallized immediately after the film is formed. To obtain a sufficient dielectric property, heat treatment is necessary for further crystallization. Since a large quantity of carbon from the organic compounds as the starting materials is incorporated in the film so that the carbon produces a bad effect on electrical properties such as an increase in leakage current, it is necessary to subject the niobium pentoxide film 207 to oxidation treatment. In the present embodiment, the crystallization treatment and the oxidation treatment are simultaneously performed. This heat treatment is performed at 700° C. or less, which is a temperature at which a bottom electrode and the barrier metal are not oxidized. To obtain a niobium pentoxide film having a good polycrystalline structure, it is desired to perform the heat treatment at 500° C. or more, which is a temperature at which niobium pentoxide is sufficiently crystallized. The conditions for the heat treatment are as follows: the atmosphere: oxygen, or dinitrogen oxide, the treatment temperature: 500 to 700° C., and the treatment time: 1 to 10 minutes.

According to this heat treatment, the crystallinity of the niobium pentoxide film 207 is improved so that the dielectric constant thereof increases, and the quantity of the carbon in the film is decreased so that leakage current is reduced.

Figure 5C:
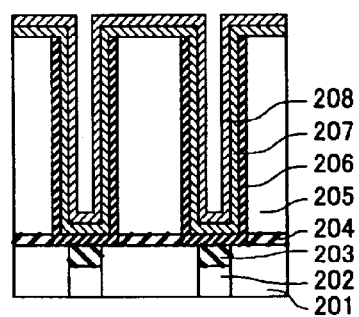

Next, a niobium.pentoxide film 208 having a film thickness of 5 nm or less is deposited over the whole of the substrate (FIG. 5C). The deposition of the niobium pentoxide film 208 may be performed under the same conditions as the deposition of the niobium pentoxide film 207.

Next, the niobium pentoxide film 208 is heat-treated. This heat treatment may be performed under the same conditions as the heat treatment of the niobium pentoxide film 207.

Figure 5D:
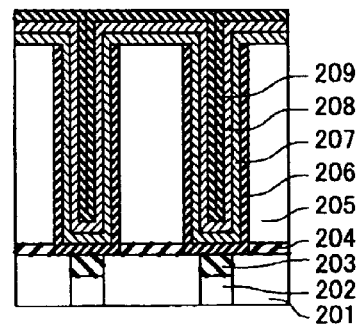

Next, a titanium nitride film is deposited on the niobium pentoxide film 208, for example, by CVD. A photoresist film is formed on the titanium nitride film, and this photoresist film is used as a mask to etch the titanium nitride film, the niobium pentoxide film 208, and the niobium pentoxide film 207, so as to form a capacitor dielectric film and a top electrode 209 (FIG. 5D).

As described above, there can be formed a data-storing capacitor element composed of the bottom electrode 206 made of ruthenium, the capacitor dielectric film made of the layered film composed of the niobium pentoxide film 207 and the niobium pentoxide film 208, and the top electrode 209 made of titanium nitride. For example, by connecting this data-storing capacitor element to a DRAM memory cell selecting MISFET in series, a memory cell of a DRAM can be made.

As the raw material making the bottom electrode 206, a platinum film or a copper film can be used instead of the ruthenium film. As the raw material making the top electrode 209, a tungsten film or a ruthenium film can be used as the titanium nitride film. The top electrode made of ruthenium may be formed under the same condition as the bottom electrode 206.

According to Embodiment 5, as the capacitor dielectric film, the niobium pentoxide films are used; therefore, the heat treatment temperature required for crystallization of the capacitor dielectric film can be made low and poor conductivity based on the oxidation of the plug 203 can be avoided. Moreover, the capacitor dielectric film is made into the layered film and thus crystal boundaries in the dielectric film are separated, whereby leakage current can be reduced. By setting the film thickness of the niobium pentoxide films making the layered film to 5 nm or less, the efficiency of the oxidation treatment is made good and residual carbon can be reduced. Additionally, stress in the film is reduced, and the density of the film and the morphology are improved. As a result, leakage current between the top electrode 209 and the bottom electrode 206 can be further decreased and the refreshing property of the DRAM can be improved.

In the present embodiment, the niobium pentoxide film having a film thickness of 5 nm or less and the niobium pentoxide film having a film thickness of 5 nm or less are formed at two stages. However, the present invention is not limited to this formation process. For example, if all of layers of a capacitor dielectric film are thin under the condition that the total film thickness of the film is constant, a maximum effect can be obtained. However, even if a niobium pentoxide film having a film thickness of more than 5 nm is formed on a niobium pentoxide film having a film thickness of 5 nm or less, or a niobium pentoxide film having a film thickness of 5 nm or less is formed on a niobium pentoxide film having a film thickness of more than 5 nm, it is possible to obtain the effect of a decrease in leakage current, based on both of the separation of the crystal boundaries and the matter that all of the layers are thin.

The dielectric film may not be necessarily formed at two stages. By forming the dielectric film at three or more stages, the film thickness per layer is made thin, whereby the effect of the decrease in leakage current, based on both of the separation of the crystal boundaries and a decrease in residual carbon, can be made large. However, as the number of the stages for the formation is larger, costs for the process are larger. It is therefore desired to set the number of the stages to three or less.

In Embodiment 5, a film made of a composition of niobium pentoxide and tantalum pentoxide can be used instead of the niobium pentoxide films used as the capacitor dielectric film. The composition ratio between niobium and tantalum for obtaining the effect thereof maybe arbitrarily selected dependently on specification required for the capacitor. In order to set the crystallization temperature of the dielectric film to 700° C. or less, at which the bottom electrode and the barrier metal are not oxidized, it is necessary to set the composition ratio of tantalum to niobium in the lower layer to 90% or less.

The present invention is not limited to the above-mentioned embodiment. Needless to say, various means described in the column "Summary of the Invention" can be used.

Embodiment 6

Embodiment 6 of the present invention will be described, referring to FIG. 6, which show steps of using a dielectric film made of a layered film of niobium pentoxide to form an MIS capacitor using polycrystalline silicon for a bottom electrode. For example, this MIS capacitor can be applied to the capacitor of the semiconductor memory device, in particular, DRAM shown in FIG. 2. A bottom electrode 210, a niobium pentoxide film 207, a niobium pentoxide film 208, and a top electrode 209 in FIG. 6 correspond to the bottom electrode 29, the niobium pentoxide film 30, the tantalum pentoxide film 31, and the top electrode 32 in FIG. 2, respectively.

First, a plug 202 is formed inside a plug-region interlayer dielectric 201 made of a silicon oxide film. The plug 202 is formed by depositing a polycrystalline silicon film doped with an N-type impurity (for example, P (phosphorus)) by CVD, and then etching-back this polycrystalline silicon film to cause some portions thereof to remain in a through hole. Instead of the etching-back, the polycrystalline silicon film may be polished and removed by CMP.

Thereafter, a silicon nitride film 204 and a capacitor-region interlayer dielectric 205 is formed in the same way as in Embodiment 5, and a hole is made in the silicon nitride film 204 and the capacitor-region interlayer dielectric 205 so that the plug 202 is made naked.

Figure 6A:
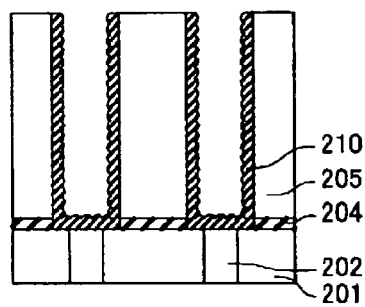
FIGS. 6A to 6D are vertical sectionals views of steps for explaining Embodiment 6 of the present invention.
Figure 6B:
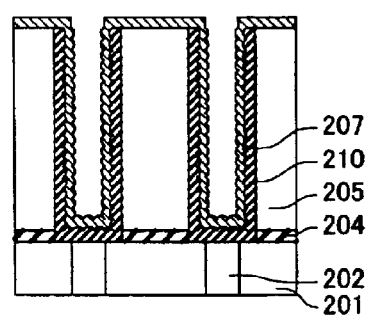

Next, a conductive amorphous silicon layer having a film thickness of 20 nm is formed over the inner face of the hole and the upper surface of the capacitor-region interlayer dielectric 205. By photolithography and dry etching, the amorphous silicon layer on the capacitor-region interlayer dielectric 205 is removed to cause the amorphous silicon layer to remain only on the inner face of the hole. The surface of the hole is seeded with silicon, and then heat-treated at 630° C. to be crystallized. At the same time, the surface is made rugged to form a bottom electrode 210 made of polycrystalline silicon (FIG. 6A).

Next, $PH_3$ is used to dope the surface of the bottom electrode 210 made of polycrystalline silicon with P. Thereafter, the resultant is heat-treated with $NH_3$ to form a silicon nitride film on the surface. The film has a very thin, that is, about 2 nm. Thus, the film is not illustrated in FIG. 6. This silicon nitride film has an effect of suppressing the oxidation of polycrystalline silicon of the bottom electrode when the insulator film is formed and heat-treated.

Next, a niobium pentoxide film 207 having a film thickness of 5 nm is formed over the whole surface of the substrate (FIG. 6B)). The deposition of the niobium pentoxide film 207 is performed in the same way as in Embodiment 5. Furthermore, the niobium pentoxide film 207 is heat-treated in the same way as in Embodiment 5.

Figure 6C:
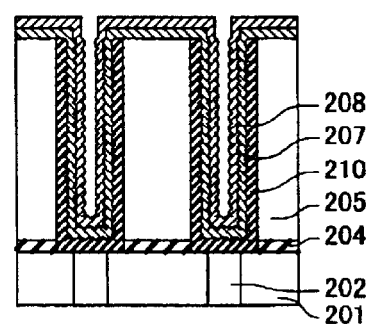

Next, a niobium pentoxide film 208 is deposited on the niobium pentoxide film 207 (FIG. 6C). The deposition of the niobium pentoxide film 208 is performed in the same way as in Embodiment 5. Furthermore, the niobium pentoxide film 208 is heat-treated in the same way as in Embodiment 5.

Figure 6D:
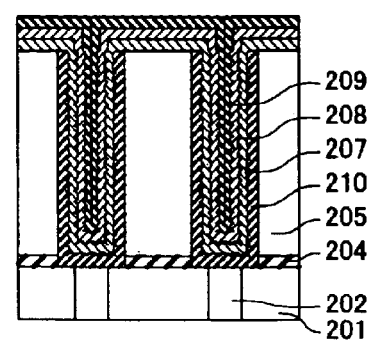

Subsequent steps are substantially the same as in Embodiment 5 (FIG. 6D).

As described above, there can be formed a data-storing capacitor element composed of the bottom electrode 210 made of polycrystalline silicon, the capacitor dielectric film made of the layered film composed of the niobium pentoxide film 207 and the niobium pentoxide film 208, and the top electrode 209 made of titanium nitride. In this way, a memory cell of a DRAM, which is composed of the memory cell selecting MISFET and the data-storing capacitor element connected thereto in series, is finished.

According to Embodiment 6, as the capacitor dielectric film, the niobium pentoxide films are used; therefore, the heat treatment temperature required for crystallization of the capacitor dielectric film can be made low and a decrease in capacitance based on the oxidation of the bottom electrode 210 made of polycrystalline silicon can be avoided. Moreover, the capacitor dielectric film is made into the layered film and thus crystal boundaries in the dielectric film are separated, whereby leakage current can be reduced. By setting the film thickness of the niobium pentoxide films making the layered film to 5 nm or less, the efficiency of the oxidation treatment is made good and residual carbon can be reduced. Additionally, stress in the film is reduced, and the density of the film and the morphology are improved. As a result, leakage current between the top electrode 209 and the bottom electrode 210 can be further decreased and the refreshing property of the DRAM can be improved.

In the present embodiment, the niobium pentoxide film having a film thickness of 5 nm or less and the niobium pentoxide film having a film thickness of 5 nm or less are formed at two stages. However, the present invention is not limited to this formation process. For example, if all of layers of a capacitor dielectric film are thin under the condition that the total film thickness of the film is constant, a maximum effect can be obtained. However, even if a niobium pentoxide film having a film thickness of more than 5 nm is formed on a niobium pentoxide film having a film thickness of 5 nm or less, or a niobium pentoxide film having a film thickness of 5 nm or less is formed on a niobium pentoxide film having a film thickness of more than 5 nm, it is possible to obtain the effect of a decrease in leakage current, based on both of the separation of the crystal boundaries and the matter that all of the layers are thin.

The dielectric film may not be necessarily formed at two stages. By forming the dielectric film at three or more stages, the film thickness per layer is made thin, whereby the effect of the decrease in leakage current, based on both of the separation of the crystal boundaries and a decrease in residual carbon, can be made large. However, as the number of the stages for the formation is larger, costs for the process are larger. It is therefore desired to set the number of the stages to three or less.

In Embodiment 6, a film made of a composition of niobium pentoxide and tantalum pentoxide can be used instead of the niobium pentoxide films used as the capacitor dielectric film. The composition ratio between niobium and tantalum for obtaining the effect thereof may be arbitrarily selected dependently on specification required for the capacitor. In order to set the crystallization temperature of the dielectric film to 700° C. or less, at which the bottom electrode and the barrier metal are not oxidized, it is necessary to set the composition ratio of tantalum to niobium in the lower layer to 40% or less.

In Embodiment 3, the portion wherein the gate insulator film is sandwiched between the substrate and the gate constitutes a capacitor having an MIS structure. To this portion is applied the capacitor of Embodiment 6 of the present invention, whereby advantageous effects of the capacitor can be produced.

The present invention is not limited to the above-mentioned embodiment. Needless to say, various means described in the column "Summary of the Invention" can be used.

Embodiment 7

Embodiment 7 of the present invention will be described, referring to FIG. 7, which show steps of using a dielectric film made of a layered film of niobium pentoxide films to form an MIS capacitor using polycrystalline silicon for a bottom electrode. For example, this MIS capacitor can be applied to the capacitor of the semiconductor memory device, in particular, DRAM shown in FIG. 2. A bottom electrode. 210, a niobium pentoxide film 207, a niobium pentoxide film 208, and a top electrode 209 in FIG. 7 correspond to the bottom electrode 29, the niobium pentoxide film 30, the tantalum pentoxide film 31, and the top electrode 32 in FIG. 2, respectively. However, in Embodiment 7, a part of outer side walls of the bottom electrode is used as a capacitor. This point is different from Embodiment 2.

First, a plug 202 is formed inside a plug-region interlayer dielectric 201 made of a silicon oxide film. The plug 202 is formed in the same way as in Embodiment 6.

Thereafter, a silicon nitride film 204, a capacitor-region interlayer dielectric 205, a silicon nitride film 211, and a silicon oxide film 212 are successively formed, and then etching using a photoresist film as a mask is performed to make a hole in such a manner that the plug 202 is made naked.

Figure 7A:
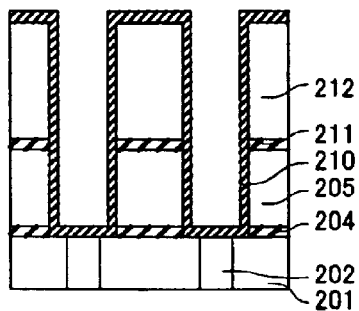
FIGS. 7A to 7D are vertical sectionals views of steps for explaining Embodiment 7 of the present invention.

Next, a conductive amorphous silicon layer having a film thickness of 20 nm is deposited over the inner face of the hole and the upper face of the silicon oxide film 212 (FIG. 7A). The amorphous silicon layer is heat-treated to be crystallized, thereby forming polycrystalline silicon. This crystallization treatment may be performed after the amorphous silicon layer is worked into a cylindrical from.

Figure 7B:

Next, a silicon oxide film 213 is deposited over the whole surface of the substrate. This silicon oxide film is preferably made into an SOG film, considering the capability of being embedded in the hole. The polycrystalline silicon film on the silicon oxide film 212 other than the film 212 inside the hole is removed. For this removal, an etch-back process or a CMP process may be used (FIG. 7B).

Figure 7C:
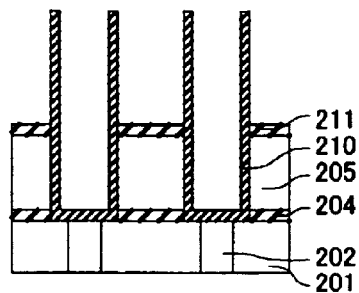

The silicon oxide film 213 remaining inside the hole and the silicon oxide film 212 outside the hole are removed by wet etching. Since the silicon nitride film 211 functions as an etching stopper, the capacitor-region interlayer dielectric 205 is not removed. In this way, a bottom electrode 210 in a cylindrical form, made of polycrystalline silicon, is formed (FIG. 7C).

Next, the resultant is heat-treated with $NH_3$ to form a silicon nitride film on the surface of the bottom electrode 210 made of polycrystalline silicon. The film has a very thin, that is, about 2 nm. Thus, the film is not illustrated in FIG. 7. This silicon nitride film has an effect of suppressing the oxidation of polycrystalline silicon of the bottom electrode when the dielectric film is formed and heat-treated.

Next, a niobium pentoxide film 207 having a film thickness of 5 nm or less is formed over the whole surface of the substrate. The deposition of the niobium pentoxide film 207 is performed in the same way as in Embodiment 5.

Furthermore, the niobium pentoxide film 207 is heat-treated in the same way as in Embodiment 5.

Next, a niobium pentoxide film 208 having a film thickness of 5 nm or less is deposited on the niobium pentoxide film 207. The deposition of the niobium pentoxide film 208 is performed in the same way as in Embodiment 5. Furthermore, the niobium pentoxide film 208 is heat-treated in the same way as in Embodiment 5.

Figure 7D:
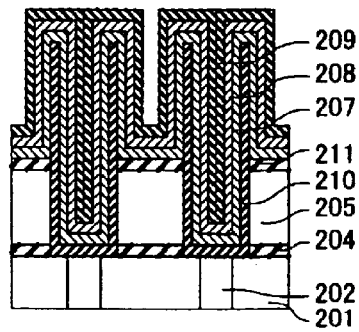

Subsequent steps are substantially the same as in Embodiment 5 (FIG. 7D).

As described above, there can be formed a data-storing capacitor element composed of the bottom electrode 210 made of polycrystalline silicon, the capacitor dielectric film made of the layered film composed of the niobium pentoxide film 207 and the niobium pentoxide film 208, and the top electrode 209 made of titanium nitride. In this way, a memory cell of a DRAM, which is composed of the memory cell selecting MISFET and the data-storing capacitor element connected thereto in series, is finished.

The material making the capacitor dielectric film and the range of the number of stages for forming the film are the same as described in Embodiment 6, and description thereon is omitted.

Advantageous effects of the present invention are also substantially the same as described in Embodiment 6. However, the capacitor capacitance is large since the dielectric film is formed outside the bottom electrode.

According to Embodiment 7, as the capacitor dielectric film, the niobium pentoxide films are used; therefore, the heat treatment temperature required for crystallization of the capacitor dielectric film can be made low and a decrease in capacitance based on the oxidation of the bottom electrode 210 made of polycrystalline silicon can be avoided. Moreover, the capacitor dielectric film is made into the layered film and thus crystal boundaries in the dielectric film are separated, whereby leakage current can be reduced. By setting the film thickness of the niobium pentoxide films making the layered film to 5 nm or less, the efficiency of the oxidation treatment is made good and residual carbon can be reduced. Additionally, stress in the film is reduced, and the density of the film and the morphology are improved. As a result, leakage current between the top electrode 209 and the bottom electrode 210 can be further decreased and the refreshing property of the DRAM can be improved.

In the present embodiment, the niobium pentoxide film having a film thickness of 5 nm or less and the niobium pentoxide film having a film thickness of 5 nm or less are formed at two stages. However, the present invention is not limited to this formation process. For example, if all of layers of a capacitor dielectric film are thin under the condition that the total film thickness of the film is constant, a maximum effect can be obtained. However, even if a niobium pentoxide film having a film thickness of more than 5 nm is formed on a niobium pentoxide film having a film thickness of 5 nm or less, or a niobium pentoxide film having a film thickness of 5 nm or less is formed on a niobium pentoxide film having a film thickness of more than 5 nm, it is possible to obtain the effect of a decrease in leakage current, based on both of the separation of the crystal boundaries and the matter that all of the layers are thin.

The dielectric film may not be necessarily formed at two stages. By forming the dielectric film at three or more stages to make the film thickness per layer small, the effect of the decrease in leakage current, based on both of the separation of the crystal boundaries and a decrease in residual carbon, can be made large. However, as the number of the stages for the formation is larger, costs for the process are larger. It is therefore desired to set the number of the stages to three or less.

In Embodiment 7, a film made of a composition of niobium pentoxide and tantalum pentoxide can be used instead of the niobium pentoxide films used as the capacitor dielectric film. The composition ratio between niobium and tantalum for obtaining the effect thereof maybe arbitrarily selected dependently on specification required for the capacitor. In order to set the crystallization temperature of the dielectric film to 700° C. or less, at which the bottom electrode and the barrier metal are not oxidized, it is necessary to set the composition ratio of tantalum to niobium in the lower layer to 40% or less. The reason why the upper limit of the composition ratio of tantalum is smaller than in Embodiment 5 is that the effect of a rise in the crystallization temperature by the addition of tantalum is larger on silicon than on ruthenium.

The present invention is not limited to the above-mentioned embodiment. Needless to say, various means described in the column "Summary of the Invention" can be used.

Embodiment 8

Embodiment 8 of the present invention will be described, referring to FIG. 8, which show steps of using a dielectric film made of a layered film of niobium pentoxide to form a planar MIM capacitor which is effective for integrating, for example, RF analog devices and CMOS logic devices in one chip.

Figure 8A:
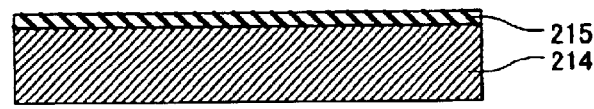
FIGS. 8A to 8D are vertical sectionals views of steps for explaining Embodiment 8 of the present invention.

First, a bottom electrode 214 made of copper (Cu) is formed. Since Cu has a large diffusion coefficient, it is necessary to form a barrier layer 215 made of TaN or the like before a dielectric film is formed (FIG. 8A).

Figure 8B:
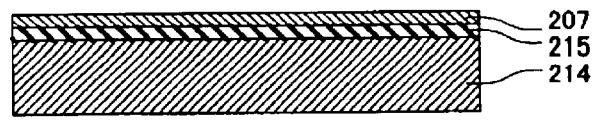

Next, a niobium pentoxide film 207 having a film thickness of 5 nm or less is formed over the whole surface of the substrate (FIG. 8B). The deposition of the niobium pentoxide film 207 is performed in the same way as in Embodiment 5. Furthermore, the niobium pentoxide film 207 is heat-treated in the same way as in Embodiment 5.

Figure 8C:
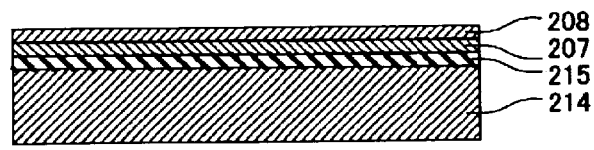
Figure 8D:
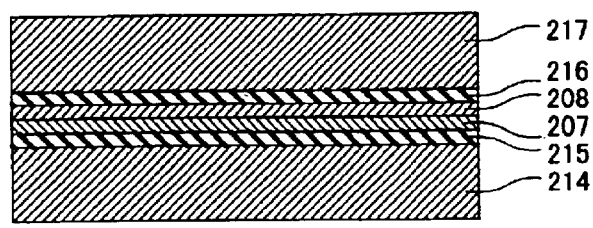

Next, a niobium pentoxide film 208 having a film thickness of 5 nm or less is formed over the niobium pentoxide film 207 (FIG. 8C). The deposition of the niobium pentoxide film 208 is performed in the same way as in Embodiment 5. Furthermore, the niobium pentoxide film 208 is heat-treated in the same way as in Embodiment 5.

Next, a barrier layer 216 made of TaN or the like is formed, and then a top electrode 217 made of Cu is formed.

As described above, there can be formed a data-storing capacitor element composed of the bottom electrode 214 made of Cu, the capacitor dielectric film made of the layered film composed of the niobium pentoxide film 207 and the niobium pentoxide film 208, and the top electrode 217 made of Cu. In order to decide the area of the capacitor, it is necessary to work each of the layers. The step for the working may be arbitrarily selected dependently on a desired shape.

According to Embodiment 8, as the capacitor dielectric film, the niobium pentoxide films are used; therefore, the heat treatment temperature required for crystallization of the capacitor dielectric film can be made low. Furthermore, the polycrystallized niobium pentoxide film is formed at two stages, thereby making it possible to make the niobium pentoxide film so as to have a high crystallinity and contain a small quantity of carbon. As a result, the capacitor dielectric film having a high dielectric constant can be obtained even on the Cu electrode, which has a low heat resistance; therefore, the accumulated electric charge quantity of the data-storing capacitor element can be increased. Moreover, leakage current between the top electrode 217 and the bottom electrode 214 can be decreased.

It can be sufficiently considered that about a planar capacitor as in Embodiment 8, the method of forming the niobium pentoxide film is not CVD but sputtering. For example, a niobium metal target is used to perform sputtering in a mixed atmosphere of argon and oxygen. In the sputtering, no organic metal compound source is used. Accordingly, no carbon is incorporated into the niobium pentoxide film and the effect of making the crystallization temperature low is produced, but the effect of decreasing residual carbon in the film is not produced. However, crystal boundaries, which will be leakage paths in the niobium pentoxide film, are separated by forming the film at multiple stages, so that leakage current of the capacitor can be decreased. By making the film thickness per layer small on the basis of the multiple-stage formation, stress in the niobium pentoxide film is reduced, and the density of the film and the morphology are improved. These facts contribute to a decrease in the leakage current.

In Embodiment 8, as the material making the capacitor dielectric film, niobium pentoxide is used. However, a solid solution of niobium pentoxide and tantalum pentoxide can be used instead of the niobium pentoxide films. The composition ratio between niobium and tantalum may be arbitrarily selected dependently on specification required for the capacitor. In order to set the crystallization temperature of the dielectric film to 700° C. or less, at which the bottom electrode and the barrier metal are not oxidized, it is necessary to set the composition ratio of tantalum to niobium to 90% or less.

The dielectric film may not be necessarily formed at two stages. By forming the dielectric film at three or more stages, the effect of the decrease in leakage current based on the separation of the crystal boundaries can be made large. The film thickness per layer is made thin, whereby the effect of the decrease in leakage current, based on the improvement in the film quality, can be made large. However, as the number of the stages for the formation is larger, costs for the process are larger. It is therefore desired to set the number of the stages to three or less. This matter can also be applied to the case that a film made of a composition of niobium pentoxide and tantalum pentoxide is used instead of the niobium pentoxide film.

The present invention is not limited to the above-mentioned embodiment. Needless to say, various means described in the column "Summary of the Invention" can be used. For example, using the dielectric film in Embodiment 1 as the capacitor dielectric film, the advantageous effect of the dielectric film can be produced. By making the material of the bottom electrode in the MIM structure of Embodiment 8 into silicon to form an MIS structure, a capacitor giving a low heat treatment temperature and a small leakage current can be formed.

Embodiment 9

Figure 9:
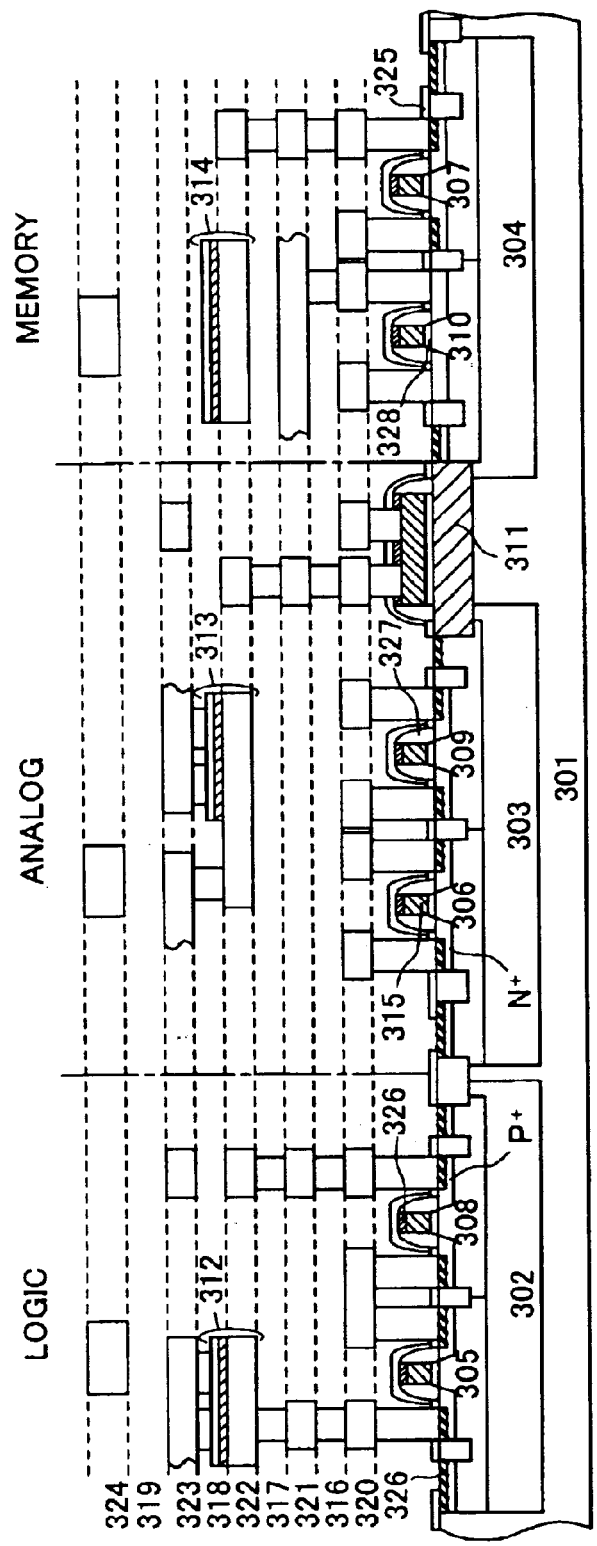
FIG. 9 is a structural view of a logic section, an analog section, and a memory section of a semiconductor integrated circuit using Embodiment 8 of the present invention.
Figure 10:
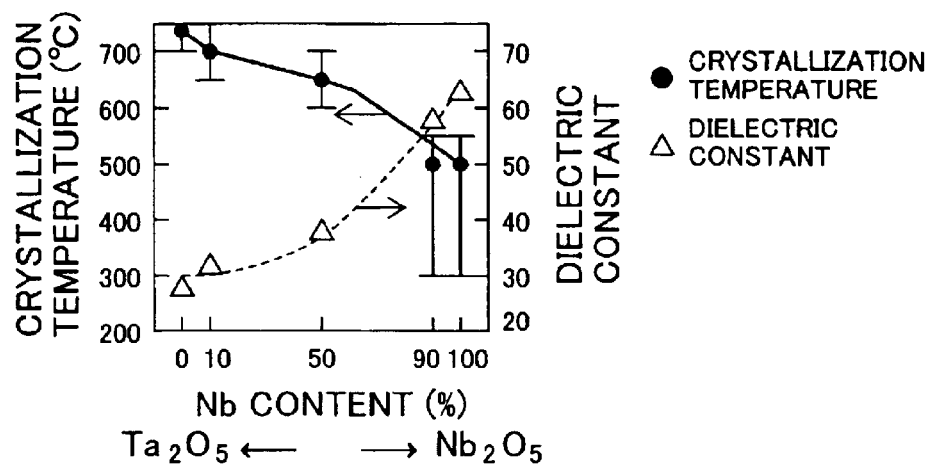
FIG. 10 is a graph for explaining the fact that in an MIM structure, as the amount of niobium added to a tantalum pentoxide film is larger, the crystallization temperature of the film becomes lower and further the dielectric constant thereof becomes larger.
Figure 11:
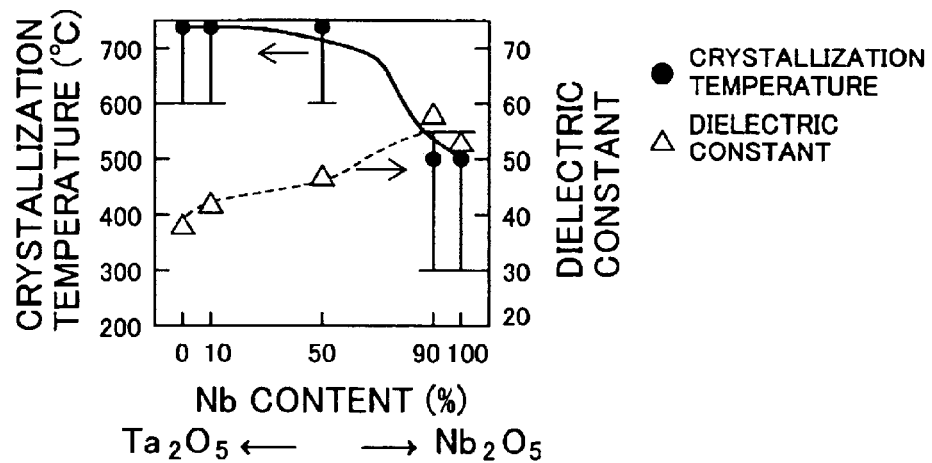
FIG. 11 is a graph for explaining the fact that in an MIS structure, as the amount of niobium added to a tantalum pentoxide film is larger, the crystallization temperature of the film becomes lower and further the dielectric constant thereof becomes larger.
Figure 12:
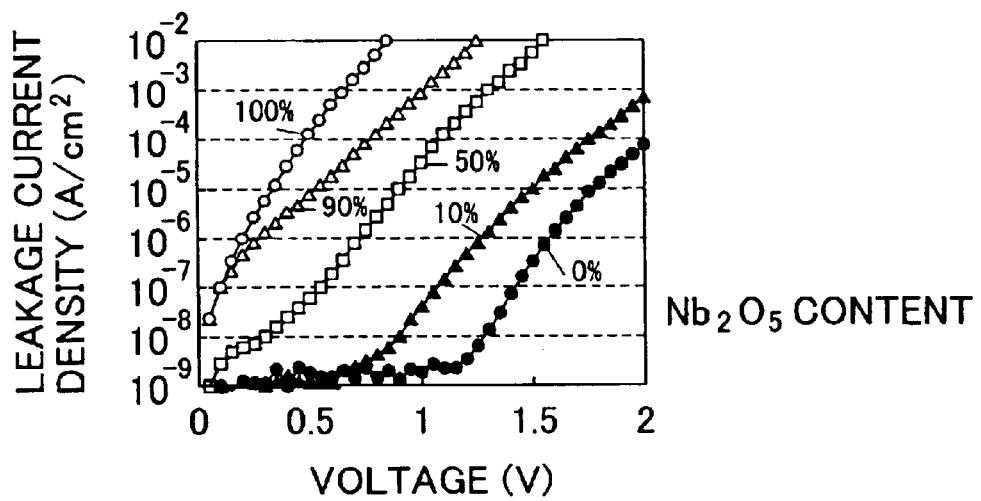
FIG. 12 is a graph for explaining the fact that as the amount of niobium added to a tantalum pentoxide film is larger, the leakage current density becomes larger.
Figure 13:
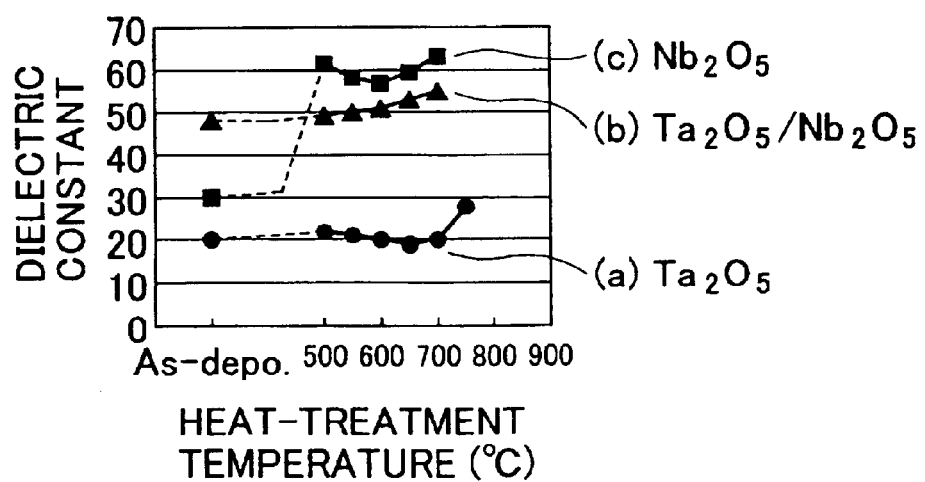
FIG. 13 is a graph for explaining an effect of a drop in crystallization temperature about a layered film composed of a tantalum pentoxide film and a niobium pentoxide film.
Figure 14:
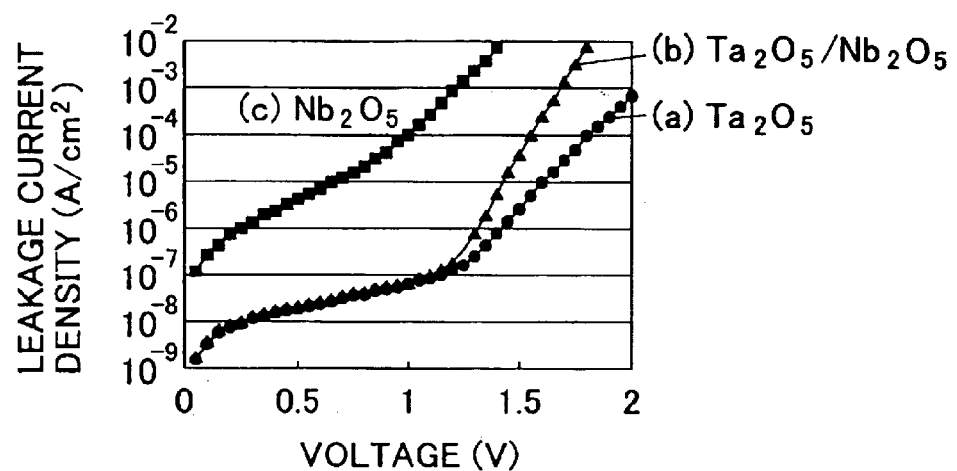
FIG. 14 is a graph for explaining an effect of a drop in leakage current about a layered film composed of a tantalum pentoxide film and a niobium pentoxide film.
Figure 15:
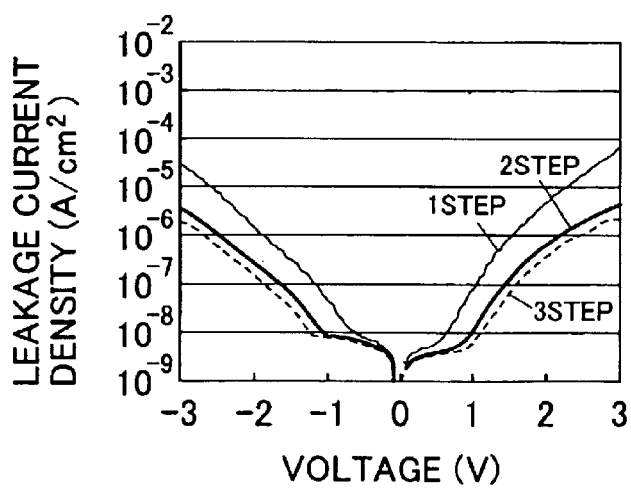
FIG. 15 is a graph for explaining an effect of a decrease in leakage current based on multiple-stage formation of a niobium pentoxide film.

Embodiment 9 of the present invention is an example of a semiconductor integrated circuit wherein RF analog device and CMOS logic devices are integrated in one chip. FIG. 9 is a structural view of a section of its logic, analog, and memory sections. In Embodiment 9, members represented by references numbers 312, 313 and 314 correspond to the MIM capacitors of Embodiment 8. The present embodiment will be described on the assumption that it has a CMOS structure. Of course, however, the present invention can be applied to the so-called BiCMOS structure wherein bipolar transistors and CMOSs are intermixed. In FIG. 9, the logic, analog, and memory sections are formed on a single P-type silicon substrate P-SUS. N-well regions 302, 303, and 304 are formed, in the form of islands, in the single P-type substrate P-SUS. In the N-well regions 302, 303, and 304, N-well regions 305, 306, and 307 are formed, respectively, and P-well regions 308, 309, and 310 are formed, respectively, as illustrated in FIG. 9. In the N-well regions 305, 306, and 307, PMOS transistors are formed, and in the P-type regions 308, 309, and 310, NMOS transistors are formed. In a portion adjacent to the transistors, a section for supplying electric current to the N-well and the P-well is illustrated. In the analog section, resistances made of a polycrystalline silicon interconnection layer 315 are illustrated. Additionally, a gate oxide film 328, a silicide layer 326, side spacers 327, a silicon nitride film 325, and so on are illustrated.

In FIG. 9, if the transistor is made into silicide as performed in the logic section, leakage current may increase in the diffused layer region. Accordingly, if the transistor made into silicide is used as a memory cell, the property for holding data in the memory cell may deteriorate. In such a case, a memory cell may be formed without making the NMOS transistor formed in the P-well region 310 into silicide, as illustrated in FIG. 9. Since the polycrystalline silicon interconnection layer 315 has a large resistance if the layer 315 is not made into silicide, there may be adopted the so-called polymetal structure wherein W or the like, which is not illustrated, may be laminated on the polycrystalline silicon interconnection 315. There may be adopted a transistor structure wherein only portions over the polycrystalline silicon interconnection 315 are selectively made into silicide but the diffused layer region is not made into silicide.

of course, it may be made into silicide, to a degree such that leakage current produces a bad effect on the holding property, in the same way as the transistor in the logic section. In this case, an additional mask for not making it into silicide is unnecessary. Thus, the costs can be made lower.

The well structure in FIG. 9 is the so-called triple well structure. The logic, analog, and memory sections are separated by the N-well regions 302, 303, and 304, respectively. This makes it possible to separate the logic, analog, and memory sections from each other electrically, so that mutual interference can be avoided. Thus, stable operation can be attained. N-well and P-well voltages suitable for the operating voltage of each of the sections can be set. Of course, in the case that such a tripe well structure is unnecessary, there may be adopted a simple structure wherein the N-well regions 302, 303, and 304 are not present; or a structure wherein only the memory section and the analog section are separated by the N-well regions 304, and 303, respectively, or two out of the three regions are surrounded by the same N-well region. As described herein, various modifications may be made if necessary.

In FIG. 9, dotted lines drawn over the substrate show positions of metal interconnection layers (320–324) and contact layers (316–319) therefor. The MIM capacitors 312, 313, and 314 are used in the logic, analog, and memory sections, respectively. For example, by fitting a capacitor to an interconnection connected to a power source in the logic section, the electrostatic capacity of the power source can be increased so that the power source can be made stable. Of course, this can be applied to the analog or memory section. This can also be applied to a capacitor element in the analog section or a memory cell in the memory section.

In a conventional 1T1C cell, as its bottom electrode, polycrystalline silicon superior in heat resistance is mainly used. As its top electrode, a metal having oxidation resistance, such as TiN, is used. In this way, a memory capacitor is formed. It is therefore difficult to use the metal interconnection layer used in the logic for the electrode of the capacitor. In the MIM capacitor of the present embodiment, as its bottom electrode, for example, a metal interconnection layer 322 as a third layer is used. After the bottom electrode is formed, a capacitor dielectric film made of a layered film is formed and further a top electrode is formed. At this time, the top electrode is formed to be fitted to the layer of a via hole 318 between a metal interconnection layer 323 as a fourth layer and the interconnection layer 322. If the interconnection layer is used as the bottom electrode of the capacitor in this way, no special process becomes necessary for forming one of the two electrodes of the capacitor in each of the logic, analog, and memory sections. In the memory section, the capacitor has a planar structure, which is different form any 1T1C cell having a conventional three-dimensional structure; therefore, the metal interconnection layer of the logic can easily be used. Because of the planar structure, working thereof is easy. As a result, the capacitor can be formed with a high yield. As the interconnection layer, for example, a metal interconnection made mainly of Al or Cu may be used. A barrier metal, which is not illustrated, may be used for each of the interconnection layers. Examples of the barrier metal include TiN and TaN.

Since Embodiment 9 is a capacitor having a simple planar structure, working thereof is easy so that costs for the production process can be decreased. Furthermore, by using the. interconnection layers as the electrodes of the MIM capacitors, the capacitors in the memory, logic, and analog sections can be formed as the same structure from the same material. Thus, the costs can be decreased, and the reliability and yield can be improved. Since the layered film made of the niobium pentoxide films is used as the high dielectric film, the crystallization temperature thereof can be made low. The oxidation of the bottom electrode and the barrier metal can be prevented, and a decrease in the capacitor capacitance and poor electric conductivity can be avoided.

In the present embodiment, the planer capacitor having the layered film made of the niobium pentoxide films is used. However, when there is used a planar capacitor using a layered film composed of tantalum pentoxide and. niobium pentoxide, as described in the respective embodiments, $(Ta_{1-x}Nb_x)_2O_5/(Ta_{1-y}Nb_y)_2O_5$ keeping the relationship of $x<y$, a layered film made of niobium pentoxide, or a layered film made of a composition of tantalum pentoxide and niobium pentoxide, an effect based on each of the capacitors can be produced.

The capacitors 312, 313, and 314 in Embodiment 9 have a planar structure. However, the concave-type capacitors in Embodiments 1, 2, 5, 6, and 7 are used to make it possible to produce effects of the respective capacitors.

The above has described the present invention made by the inventors specifically on the basis of the embodiments. However, the present invention is not limited to the above-mentioned embodiments. The present invention can be modified into various embodiments if the embodiments do not depart from the subject matter of the present invention. The following will give examples thereof.

Since Embodiments 1, 5, and 8 are each a capacitor having an MIM structure, the capacitor dielectric film of each of the above-mentioned embodiments may be replaced by the MIM capacitor and the effect thereof can be obtained. Similarly, since Embodiments 2, 6, and 7 are each a capacitor having an MIS structure, the capacitor dielectric film of each of the above-mentioned embodiments may be replaced by the MIS capacitor and the effect thereof can be obtained.

The portion wherein the gate insulator film is sandwiched between the substrate and the gate in Embodiment 3 constitutes a capacitor having an MIS structure. To this capacitor portion is applied each of the capacitor dielectric films in Embodiments 2 and 6, whereby advantageous effects of each of the dielectric films can be produced.

The MISFET described in Embodiment 3 can be applied to all semiconductor devices, for example, SRAMs, or electrically rewritable ROMs of a collectively-erasing type, such as a memory cell selecting MISFET of a DRAM and a MISFET of a peripheral circuit.

Each of the capacitors of Embodiments 1, 2, 5, 6, 7, and 8 can be applied to not only a DRAM but also all semiconductor devices wherein a DRAM is mounted, or all semiconductor devices having a capacitor.

The present invention has been described mainly by way of the examples of the layered film made of the tantalum pentoxide film and the niobium pentoxide film in Embodiments 1, 2, 3, and 4, and the examples of the layered film made of the niobium pentoxide films in Embodiments 5, 6, 7, and 8. In each of the embodiments, a combination of the films described in the column "Summary of the Invention" can be used, or a combination of the films described in the other embodiments can be used, whereby advantageous effects described in each of the column and the embodiments can be produced.

What is claimed is:

1. A method of manufacturing a semiconductor device comprising:

forming a MISFET on a principal surface of a semiconductor substrate;

forming a first insulating film on said MISFET;

forming a plug in said first insulating film connecting a source or drain region of said MISFET;

forming a bit line over said first insulating film;

forming a second insulating film over said bit line and first insulating film;

forming a groove in said second insulating film;

forming a storage electrode in said groove;

forming a niobium oxide film on said storage electrode, and then annealing said niobium oxide film for crystallizing said niobium oxide film;

forming a tantalum oxide film on said crystallized niobium film, and then annealing said tantalum oxide film for crystallizing said tantalum oxide film; and forming a plate electrode on said tantalum oxide film.

2. The method of manufacturing a semiconductor device according to claim 1, wherein said storage electrode is formed of a material selected from a group consisting of ruthenium, platinum and copper.

3. The method of manufacturing a semiconductor device according to claim 2, wherein said storage electrode is formed of ruthenium (Ru) which is formed by a combination of sputtering and chemical vapor deposition (CVD).

4. The method of manufacturing a semiconductor device according to claim 3, wherein said Ru electrode is formed by CVD using $Ru(C_2H_4C_2H_5)_2$ and $(C_2H_4)_2O$.

5. The method of manufacturing a semiconductor device according to claim 1, wherein a barrier metal is formed between said storage electrode and said plug.

6. The method of manufacturing a semiconductor device according to claim 1, wherein said plate electrode is formed of titanium nitride.

7. The method of manufacturing a semiconductor device according to claim 1, wherein a thickness of said niobium oxide film and tantalum oxide film is less than 5 nm.

8. A method of manufacturing a semiconductor device comprising:

forming a MISFET on a principal surface of a semiconductor substrate;

forming a first insulating film on said MISFET;

forming a first plug in said first insulating film connecting one of a source or drain region of said MISFET;

forming a bit line over said first insulating film;

forming a second insulating film over said bit line and first insulating film;

forming a second plug in said second insulating film connecting said the another one of said source or drain region;

forming a third insulating film over said second insulating film;

forming a groove in said third insulating film;

forming a storage electrode in said groove;

forming a niobium oxide film on said storage electrode, and then annealing said niobium oxide film for crystallizing said niobium oxide film, forming a tantalum oxide film on said crystallized niobium oxide film, and then annealing said tantalum oxide film for crystallizing said tantalum oxide film; and forming a plate electrode on said tantalum oxide film.

9. The method of manufacturing a semiconductor device according to claim 8, wherein said storage electrode is formed of a material selected from a group consisting of ruthenium, platinum and copper.

10. The method of manufacturing a semiconductor device according to claim 9, wherein said storage electrode is formed of ruthenium (Ru) which is formed by a combination of sputtering and chemical vapor deposition (CVD).

11. The method of manufacturing a semiconductor device according to claim 10, wherein said Ru electrode is formed by CVD using $Ru(C_2H_4C_2H_5)_2$ and $(C_2H_4)_2O$.

12. The method of manufacturing a semiconductor device according to claim 8, wherein a barrier metal is formed between said storage electrode and said second plug.

13. The method of manufacturing a semiconductor device according to claim 8, wherein said plate electrode is formed of titanium nitride.

14. The method of manufacturing a semiconductor device according to claim 8, wherein said niobium oxide film and tantalum oxide film is less than 5 nm.

* * * * *